US012794444B2

(12) United States Patent
Inoue

(10) Patent No.: US 12,794,444 B2
(45) Date of Patent: Nov. 10, 2026

(54) ACOUSTIC WAVE DEVICE

(71) Applicant: Murata Manufacturing Co., Ltd., Nagaokakyo (JP)

(72) Inventor: Kazunori Inoue, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 609 days.

(21) Appl. No.: 18/370,641

(22) Filed: Sep. 20, 2023

(65) Prior Publication Data

US 2024/0014800 A1 Jan. 11, 2024

Related U.S. Application Data

(63) Continuation of application No. PCT/JP2022/014110, filed on Mar. 24, 2022.

(Continued)

(51) Int. Cl.
*H03H 9/13* (2006.01)
*H03H 3/02* (2006.01)
*H03H 9/02* (2006.01)

(52) U.S. Cl.
CPC .............. *H03H 9/132* (2013.01); *H03H 3/02* (2013.01); *H03H 9/02015* (2013.01); *H03H 9/02157* (2013.01); *H03H 2003/021* (2013.01)

(58) Field of Classification Search
CPC ...... H03H 9/132; H03H 3/02; H03H 9/02015; H03H 9/02157; H03H 2003/021;

(Continued)

(56) References Cited

U.S. PATENT DOCUMENTS 7,259,500 B2 * 8/2007 Iwamoto ................ H03H 9/059 310/344
8,471,433 B2 * 6/2013 Yamaji ................... H03H 9/059 310/313 R (Continued)

FOREIGN PATENT DOCUMENTS

CN 207638628 U 7/2018
CN 111434037 A 7/2020

(Continued)

OTHER PUBLICATIONS

International Search Report in PCT/JP2022/014110, mailed May 31, 2022, 3 pages.

(Continued)

*Primary Examiner* — Pedro J Cuevas
(74) *Attorney, Agent, or Firm* — Keating & Bennett, LLP

(57) ABSTRACT

An acoustic wave device includes a piezoelectric layer that includes a first main surface and a second main surface opposite to the first main surface, a functional electrode on the piezoelectric layer, and a support on the second main surface of the piezoelectric layer and including a support substrate. The support includes a hollow portion overlapping at least a portion of the functional electrode in plan view in a lamination direction of the support and the piezoelectric layer. A through hole communicating with the hollow portion is provided in the piezoelectric layer. The first main surface of the piezoelectric layer includes a reinforcing lid portion to close the through hole.

25 Claims, 32 Drawing Sheets

Related U.S. Application Data

(60) Provisional application No. 63/168,294, filed on Mar. 31, 2021.

(58) Field of Classification Search
CPC ...... H03H 9/0523; H03H 9/105; H03H 9/173; H03H 9/02228
See application file for complete search history.

(56) References Cited

U.S. PATENT DOCUMENTS

| | | | | |
|---|---|---|---|---|
| 9,978,929 | B2 * | 5/2018 | Hira | H03H 9/1085 |
| 10,707,830 | B2 * | 7/2020 | Kikuchi | H03H 9/02637 |
| 11,444,596 | B2 * | 9/2022 | Sekiya | H03H 9/02559 |
| 11,637,232 | B2 * | 4/2023 | Osawa | H10N 30/874 310/311 |
| 12,355,427 | B2 * | 7/2025 | Yamane | H03H 9/587 |
| 12,413,198 | B2 * | 9/2025 | Inoue | H03H 9/568 |
| 12,413,200 | B2 * | 9/2025 | Inoue | H03H 9/174 |
| 12,531,542 | B2 * | 1/2026 | Kimura | H03H 9/02228 |
| 12,537,500 | B2 * | 1/2026 | Kimura | H03H 9/02015 |
| 12,537,501 | B2 * | 1/2026 | Kimura | H03H 9/02015 |
| 12,537,504 | B2 * | 1/2026 | Ouchi | H03H 9/02228 |
| 12,542,527 | B2 * | 2/2026 | Kimura | H03H 3/02 |
| 12,556,156 | B2 * | 2/2026 | Nagatomo | H03H 9/02228 |
| 12,567,849 | B2 * | 3/2026 | Inoue | H03H 3/02 |
| 12,567,850 | B2 * | 3/2026 | Ishii | H03H 9/02133 |
| 12,609,675 | B2 * | 4/2026 | Yamazaki | H03H 9/02992 |
| 12,615,031 | B2 * | 4/2026 | Inoue | H03H 9/02228 |
| 2010/0052473 | A1 * | 3/2010 | Kimura | H03H 9/1092 29/25.35 |
| 2010/0225202 | A1 * | 9/2010 | Fukano | H03H 9/059 310/313 C |
| 2011/0043078 | A1 | 2/2011 | Tsuda | |
| 2011/0221546 | A1 * | 9/2011 | Yamaji | H03H 9/0547 333/193 |
| 2014/0009032 | A1 | 1/2014 | Takahashi et al. | |
| 2014/0152145 | A1 | 6/2014 | Kando et al. | |
| 2015/0194948 | A1 * | 7/2015 | Inate | H03H 3/08 29/25.35 |
| 2017/0093366 | A1 * | 3/2017 | Kikuchi | H03H 9/059 |
| 2017/0264266 | A1 | 9/2017 | Kishimoto | |
| 2017/0309679 | A1 * | 10/2017 | Kawasaki | H03H 9/0542 |
| 2018/0131345 | A1 * | 5/2018 | Fukuda | C30B 29/30 |
| 2020/0295730 | A1 | 9/2020 | Nagatomo et al. | |
| 2021/0013867 | A1 * | 1/2021 | Inoue | H03H 9/059 |
| 2021/0036211 | A1 * | 2/2021 | Osawa | H03H 9/1071 |
| 2023/0084340 | A1 * | 3/2023 | Ouchi | H03H 9/173 333/193 |
| 2023/0141873 | A1 * | 5/2023 | Yamane | H03H 9/587 333/189 |
| 2023/0155565 | A1 * | 5/2023 | Ouchi | H03H 9/02228 310/363 |
| 2023/0155566 | A1 * | 5/2023 | Kimura | H03H 9/0211 333/192 |
| 2023/0163747 | A1 * | 5/2023 | Nagatomo | H03H 9/02992 310/313 R |
| 2023/0246619 | A1 * | 8/2023 | Inoue | H03H 3/02 333/187 |
| 2023/0261639 | A1 * | 8/2023 | Kimura | H03H 9/14541 310/313 R |
| 2023/0275554 | A1 * | 8/2023 | Inoue | H03H 9/02015 |
| 2023/0275555 | A1 * | 8/2023 | Kimura | H03H 9/02015 310/348 |
| 2023/0275556 | A1 * | 8/2023 | Kimura | H03H 9/02086 310/311 |
| 2023/0275560 | A1 * | 8/2023 | Kubo | H03H 9/02031 |
| 2023/0327634 | A1 * | 10/2023 | Inoue | H03H 9/02 |
| 2023/0327636 | A1 * | 10/2023 | Ouchi | H03H 9/02157 310/365 |
| 2023/0327638 | A1 * | 10/2023 | Suzuki | H03H 3/02 333/187 |
| 2023/0327639 | A1 * | 10/2023 | Inoue | H03H 9/02086 333/187 |
| 2023/0336140 | A1 * | 10/2023 | Inoue | H03H 9/02062 |
| 2023/0336148 | A1 * | 10/2023 | Nagatomo | H03H 9/25 |
| 2023/0344409 | A1 * | 10/2023 | Inoue | H03H 9/02157 |
| 2023/0361749 | A1 * | 11/2023 | Inoue | H03H 9/02015 |
| 2023/0361754 | A1 * | 11/2023 | Kishimoto | H03H 9/173 |
| 2023/0412138 | A1 * | 12/2023 | Kimura | H03H 9/02015 |
| 2023/0412139 | A1 * | 12/2023 | Kimura | H03H 9/02015 |
| 2023/0412141 | A1 * | 12/2023 | Kimura | H03H 9/02015 |
| 2023/0421129 | A1 * | 12/2023 | Kimura | H03H 9/02157 |
| 2024/0007082 | A1 * | 1/2024 | Inoue | H03H 9/174 |
| 2024/0014793 | A1 * | 1/2024 | Inoue | H03H 9/02228 |
| 2024/0014795 | A1 * | 1/2024 | Inoue | H03H 9/205 |
| 2024/0014797 | A1 * | 1/2024 | Inoue | H03H 9/02015 |
| 2024/0014802 | A1 * | 1/2024 | Kimura | H03H 9/02228 |
| 2024/0030886 | A1 * | 1/2024 | Inoue | H03H 9/568 |
| 2024/0048114 | A1 * | 2/2024 | Ishii | H03H 9/02133 |
| 2024/0048115 | A1 * | 2/2024 | Inoue | H03H 3/02 |
| 2024/0080009 | A1 * | 3/2024 | Iyama | H03H 9/02062 |
| 2024/0088864 | A1 * | 3/2024 | Inoue | H03H 9/176 |
| 2024/0097643 | A1 * | 3/2024 | Inoue | H03H 9/02133 |
| 2024/0113683 | A1 * | 4/2024 | Omura | H03H 9/173 |
| 2024/0113684 | A1 * | 4/2024 | Kimura | H03H 9/02157 |
| 2024/0154601 | A1 * | 5/2024 | Inoue | H03H 9/02228 |
| 2024/0235519 | A1 * | 7/2024 | Inoue | H03H 3/04 |
| 2024/0235521 | A1 * | 7/2024 | Yamane | H03H 9/0523 |
| 2024/0250661 | A1 * | 7/2024 | Yamane | H03H 3/08 |
| 2024/0267016 | A1 * | 8/2024 | Yamane | H03H 3/08 |
| 2024/0267017 | A1 * | 8/2024 | Jonosono | H03H 3/02 |
| 2024/0291465 | A1 * | 8/2024 | Yamane | H03H 9/1071 |
| 2024/0297634 | A1 * | 9/2024 | Daimon | H03H 9/14517 |
| 2024/0305271 | A1 * | 9/2024 | Yamazaki | H03H 9/02992 |
| 2024/0333250 | A1 * | 10/2024 | Yamane | H03H 9/17 |
| 2024/0364294 | A1 * | 10/2024 | Daimon | H03H 9/562 |
| 2024/0364295 | A1 * | 10/2024 | Yamane | H03H 9/02031 |
| 2024/0364296 | A1 * | 10/2024 | Daimon | H03H 9/02574 |
| 2024/0364300 | A1 * | 10/2024 | Daimon | H03H 9/568 |
| 2024/0372524 | A1 * | 11/2024 | Jonosono | H03H 9/02157 |
| 2024/0372525 | A1 * | 11/2024 | Yamane | H03H 9/02559 |
| 2025/0007493 | A1 * | 1/2025 | Nagatomo | H03H 9/25 |
| 2025/0015779 | A1 * | 1/2025 | Yamaji | H03H 9/25 |
| 2025/0015781 | A1 * | 1/2025 | Daimon | H03H 9/0504 |
| 2025/0015784 | A1 * | 1/2025 | Nagatomo | H03H 9/173 |
| 2025/0023546 | A1 * | 1/2025 | Daimon | H03H 9/02228 |
| 2025/0023553 | A1 * | 1/2025 | Okada | H03H 9/176 |
| 2025/0080078 | A1 * | 3/2025 | Inoue | H03H 9/25 |
| 2025/0112618 | A1 * | 4/2025 | Nodake | H03H 9/145 |
| 2025/0112622 | A1 * | 4/2025 | Daimon | H03H 9/02086 |
| 2025/0119114 | A1 * | 4/2025 | Daimon | H03H 9/02031 |
| 2025/0158591 | A1 * | 5/2025 | Daimon | H03H 9/175 |
| 2025/0158592 | A1 * | 5/2025 | Nagatomo | H03H 9/02992 |
| 2025/0167757 | A1 * | 5/2025 | Daimon | H03H 9/64 |
| 2025/0167760 | A1 * | 5/2025 | Nagatomo | H03H 9/02015 |
| 2025/0175139 | A1 * | 5/2025 | Daimon | H03H 9/173 |
| 2025/0175145 | A1 * | 5/2025 | Nakamura | H03H 9/02992 |
| 2025/0183868 | A1 * | 6/2025 | Daimon | H03H 9/02086 |
| 2025/0183870 | A1 * | 6/2025 | Mimura | H03H 9/132 |
| 2025/0183876 | A1 * | 6/2025 | Nagatomo | H03H 9/562 |
| 2025/0260384 | A1 * | 8/2025 | Okunaga | H03H 9/25 |
| 2026/0095141 | A1 * | 4/2026 | Iyama | H03H 9/02157 |
| 2026/0128727 | A1 * | 5/2026 | Kimura | H03H 9/02228 |

FOREIGN PATENT DOCUMENTS

| | | | | |
|---|---|---|---|---|
| JP | 2011147098 | A | 7/2011 | |
| JP | 2014013991 | A | 1/2014 | |
| WO | 2012073871 | A1 | 6/2012 | |
| WO | 2016103925 | A1 | 6/2016 | |
| WO | 2016147687 | A1 | 9/2016 | |
| WO | 2020209152 | A1 | 10/2020 | |
| WO | WO-2023058755 | A1 * | 4/2023 | H03H 9/25 |
| WO | WO-2023191089 | A1 * | 10/2023 | H03H 3/02 |

OTHER PUBLICATIONS

Written Opinion in PCT/JP2022/014110, mailed May 31, 2022, 4 pages.

(56) References Cited

OTHER PUBLICATIONS

Official Communication issued in corresponding Chinese Patent Application No. 202280025222.1, mailed on Jun. 18, 2026, 12 pages.

* cited by examiner

ACOUSTIC WAVE DEVICE

CROSS REFERENCE TO RELATED APPLICATIONS

This application claims the benefit of priority to Provisional Application No. 63/168,294 filed on Mar. 31, 2021 and is a Continuation Application of PCT Application No. PCT/JP2022/014110 filed on Mar. 24, 2022. The entire contents of each application are hereby incorporated herein by reference.

BACKGROUND OF THE INVENTION

1. Field of the Invention

The present disclosure relates to an acoustic wave device including a piezoelectric layer.

2. Description of the Related Art

For example, WO 2016/147687 discloses an acoustic wave device including a support substrate, a thin film, a piezoelectric substrate, and an interdigital transducer (IDT) electrode. The support substrate has a recessed portion on an upper surface thereof. The thin film is disposed on the support substrate. The piezoelectric substrate has a first main surface and a second main surface facing the first main surface, and the first main surface side is disposed on the thin film. The IDT electrode is provided on the second main surface of the piezoelectric substrate. A cavity surrounded by the support substrate and at least the thin film out of the thin film and the piezoelectric substrate is formed. In a region on the first main surface of the piezoelectric substrate, a thin film is disposed in a region bonded to the support substrate with the thin film interposed therebetween and at least partially in a region above the cavity.

SUMMARY OF THE INVENTION

An acoustic wave device in which a through hole is formed in a piezoelectric layer is known. When the through hole is formed in the piezoelectric layer, a mechanical strength around the through hole is reduced. Therefore, it is desired to improve the mechanical strength of the piezoelectric layer.

Preferred embodiments of the present invention provide acoustic wave devices each capable of improving a mechanical strength of a piezoelectric layer.

An acoustic wave device according to an aspect of a preferred embodiment of the present disclosure includes a piezoelectric layer including a first main surface and a second main surface opposite to the first main surface, a functional electrode on the piezoelectric layer, and a support on the second main surface of the piezoelectric layer and including a support substrate, in which the support is provided with a hollow portion overlapping at least a portion of the functional electrode in plan view in a lamination direction of the support and the piezoelectric layer, a through hole communicating with the hollow portion is provided in the piezoelectric layer, and the first main surface of the piezoelectric layer is provided with a reinforcing lid portion to close the through hole.

A method of manufacturing an acoustic wave device according to an aspect of a preferred embodiment of the present disclosure includes a piezoelectric layer forming step of laminating a support including a support substrate on a piezoelectric layer including a first main surface and a second main surface opposite to the first main surface and including a sacrificial layer formed on the second main surface, and forming a functional electrode on the piezoelectric layer, a through hole forming step of forming a through hole extending through the piezoelectric layer at a position of the piezoelectric layer, the position overlapping the sacrificial layer in plan view in a lamination direction of the support and the piezoelectric layer, a hollow portion forming step of removing the sacrificial layer from the through hole to form a hollow portion in the support, and a reinforcing lid portion forming step of forming a reinforcing lid portion to close the through hole.

A method of manufacturing an acoustic wave device according to another aspect of a preferred embodiment of the present disclosure includes a piezoelectric layer forming step of laminating a support including a support substrate on a piezoelectric layer including a sacrificial layer formed on a second main surface out of a first main surface and the second main surface facing each other, and forming, on the piezoelectric layer, a functional electrode and a wiring electrode electrically connected to the functional electrode, a through hole forming step of forming a through hole at a position of the piezoelectric layer, the position overlapping the sacrificial layer in plan view in a lamination direction of the support and the piezoelectric layer, a hollow portion forming step of removing the sacrificial layer from the through hole to form a hollow portion in the support, a support forming step of applying a photosensitive resin to the first main surface of the piezoelectric layer, and exposing, developing, and curing the photosensitive resin to form a support such that at least a portion of the support overlaps the wiring electrode in plan view, a lid forming step of forming a lid on the support, a terminal hole forming step of forming a terminal hole extending through the support and the lid and exposing the wiring electrode, an under-bump metal forming step of forming an under-bump metal in the terminal hole, and a bump forming step of forming a bump on the under-bump metal, in which the support forming step includes forming a reinforcing lid portion that closes the through hole.

According to preferred embodiments of the present disclosure, it is possible to provide acoustic wave devices capable of improving a mechanical strength of a piezoelectric layer.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Acoustic wave devices according to each of first, second, and third aspects of preferred embodiments of the present invention each includes a piezoelectric layer made of lithium niobate or lithium tantalate, and first and second electrodes facing each other in a direction intersecting a thickness direction of the piezoelectric layer.

In the acoustic wave device of the first aspect, a first-order thickness shear mode bulk wave is used.

Further, in the acoustic wave device of the second aspect, the first electrode and the second electrode are adjacent electrodes, and d/p is about 0.5 or less, for example, where d is a thickness of the piezoelectric layer and p is a center-to-center distance between the first electrode and the second electrode. As a result, in the first and second aspects, a Q value can be increased even when the size of the acoustic wave device is further reduced.

Further, in the acoustic wave device of the third aspect, Lamb waves are used as plate waves. Then, resonance characteristics due to the Lamb wave can be obtained.

An acoustic wave device according to a fourth aspect of a preferred embodiment of the present invention includes a piezoelectric layer made of lithium niobate or lithium tantalate, and an upper electrode and a lower electrode facing each other in a thickness direction of the piezoelectric layer with the piezoelectric layer interposed therebetween, and uses bulk waves.

Hereinafter, the present disclosure will be clarified by describing specific preferred embodiments of the acoustic wave devices of the first to fourth aspects of preferred embodiments of the present invention with reference to the drawings.

First Preferred Embodiment

Figure 1A:
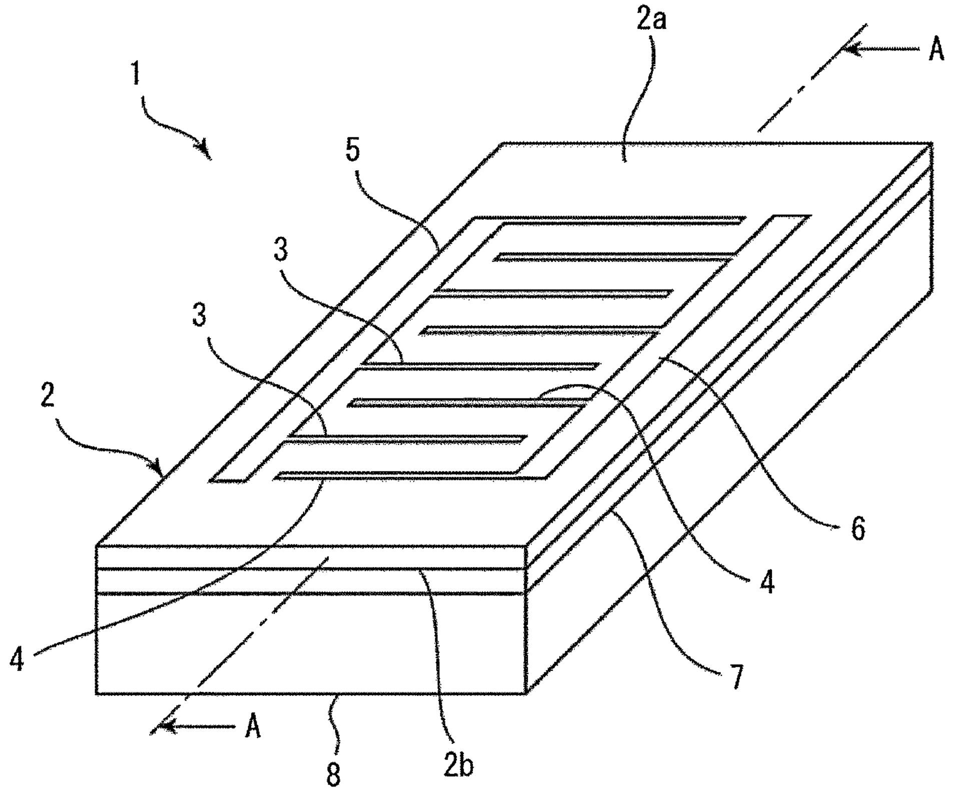
FIG. 1A is a schematic perspective view illustrating an appearance of an acoustic wave device of first and second aspects of a preferred embodiment of the present invention.
Figure 1B:
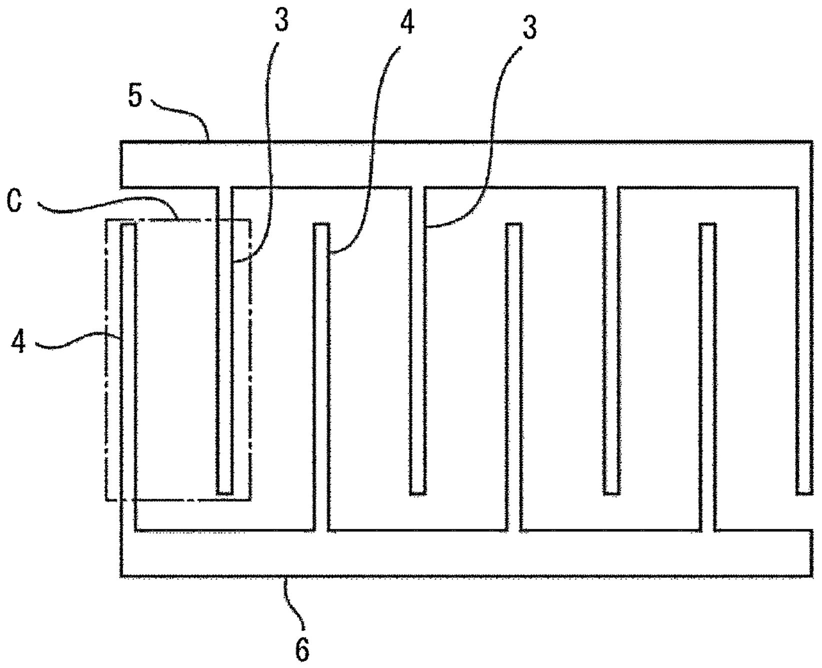
FIG. 1B is a plan view illustrating an electrode structure on a piezoelectric layer.
Figure 2:
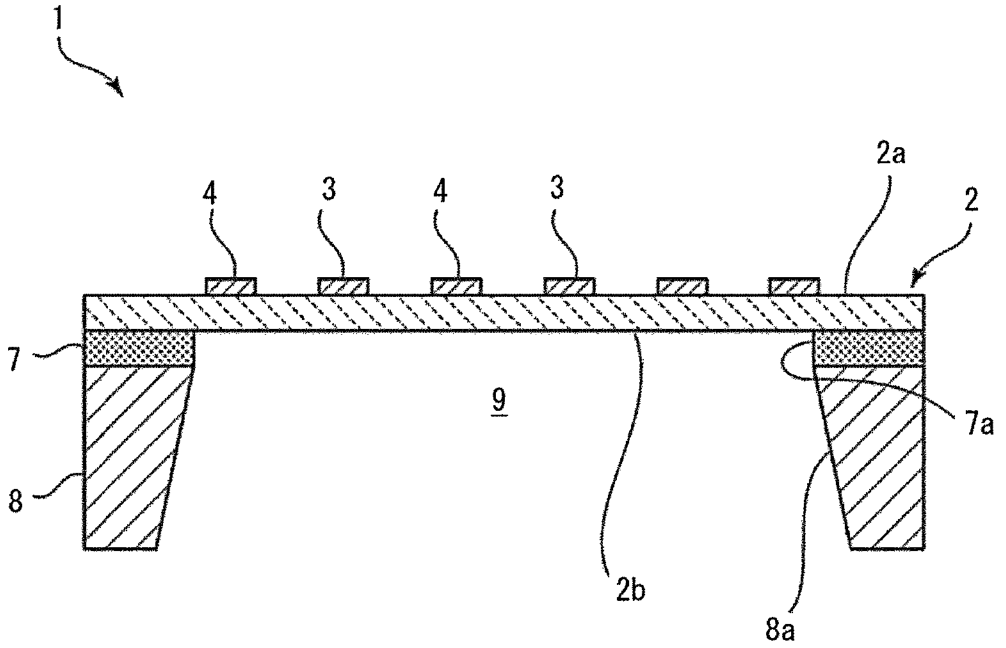
FIG. 2 is a sectional view of a portion taken along line A-A in FIG. 1A.

FIG. 1A is a schematic perspective view illustrating an appearance of an acoustic wave device according to a first preferred embodiment with respect to the first and second aspects, FIG. 1B is a plan view illustrating an electrode structure on a piezoelectric layer, and FIG. 2 is a sectional view of a portion taken along line A-A in FIG. 1A.

An acoustic wave device 1 has a piezoelectric layer 2 made of $LiNbO_3$. The piezoelectric layer 2 may be made of $LiTaO_3$. Cut-angles of $LiNbO_3$ and $LiTaO_3$ is Z-cut in the present preferred embodiment, but may be rotated Y-cut or X-cut. Preferably, the Y-propagation and X-propagation±about 30° propagation orientations are preferred. Although a thickness of the piezoelectric layer 2 is not particularly limited, it is preferably about 50 nm or more and about 1000 nm or less, for example, in order to effectively excite the first-order thickness shear mode.

The piezoelectric layer 2 has first and second main surfaces 2*a* and 2*b* facing each other. Electrodes 3 and 4 are provided on the first main surface 2*a*. Here, the electrode 3 is an example of the "first electrode" and the electrode 4 is an example of the "second electrode". In FIGS. 1A and 1B, a plurality of electrodes 3 are a plurality of first electrode fingers connected to a first busbar 5. The plurality of electrodes 4 are a plurality of second electrode fingers connected to a second busbar 6. The plurality of electrodes 3 and the plurality of electrodes 4 are interdigitated with each other.

Each of the electrodes 3 and 4 has a rectangular shape and a length direction. The electrode 3 and the adjacent electrode 4 face each other in a direction orthogonal to the length direction. The plurality of electrodes 3 and 4, the first busbar 5 and the second busbar 6 define an interdigital transducer (IDT) electrode. Both the length directions of the electrodes 3 and 4 and the direction orthogonal to the length direction of the electrodes 3 and 4 are directions intersecting the thickness direction of the piezoelectric layer 2. Therefore, it can be said that the electrode 3 and the adjacent electrode 4 face each other in the direction intersecting the thickness direction of the piezoelectric layer 2.

Moreover, the length direction of the electrodes 3 and 4 may be interchanged with the direction orthogonal to the length direction of the electrodes 3 and 4 illustrated in FIGS. 1A and 1B. That is, in FIGS. 1A and 1B, the electrodes 3 and 4 may extend in the direction in which the first busbar 5 and the second busbar 6 extend. In that case, the first busbar 5 and the second busbar 6 extend in the direction in which the electrodes 3 and 4 extend in FIGS. 1A and 1B.

A plurality of pairs each including an electrode 3 connected to one potential and an electrode 4 connected to the other potential adjacent to each other are provided in the direction orthogonal to the length direction of the electrodes 3 and 4. Here, the electrodes 3 and 4 being adjacent to each other does not mean that the electrodes 3 and 4 are disposed so as to be in direct contact with each other, but that the electrodes 3 and 4 are disposed with a gap therebetween.

When the electrodes 3 and 4 are adjacent to each other, electrodes connected to a hot electrode or a ground electrode, including other electrodes 3 and 4, are not disposed between the electrodes 3 and 4 adjacent to each other. The number of pairs need not be integer pairs, but may be 1.5 pairs, 2.5 pairs, or the like. A center-to-center distance, that is, a pitch between the electrodes 3 and 4 is preferably in a range of about 1 μm or more and about 10 μm or less, for example. Further, the center-to-center distance between the electrodes 3 and 4 is a distance connecting a center of a width dimension of the electrode 3 in the direction orthogonal to the length direction of the electrode 3 and a center of a width dimension of the electrode 4 in the direction orthogonal to the length direction of the electrode 4. Furthermore, when at least one of the electrodes 3 and 4 includes a plurality of electrodes (when the electrodes 3 and 4 form a pair of electrodes and there are 1.5 or more pairs of electrodes), the center-to-center distance between the electrodes 3 and 4 refers to the average value of the center-to-center distances of the adjacent electrodes 3 and 4 among the 1.5 or more pairs of electrodes 3 and 4. Moreover, the width of the electrodes 3 and 4, that is, the dimension in the facing direction of the electrodes 3 and 4 is preferably in the range of about 150 nm or more and about 1000 nm or less, for example. The center-to-center distance between the electrodes 3 and 4 is a distance connecting the center of the dimension (width dimension) of the electrode 3 in the direction orthogonal to the length direction of the electrode 3 and the center of the dimension (width dimension) of the electrode 4 in the direction orthogonal to the length direction of the electrode 4.

In the present preferred embodiment, since the Z-cut piezoelectric layer is used, the direction orthogonal to the length direction of the electrodes 3 and 4 is the direction orthogonal to a polarization direction of the piezoelectric layer 2. This is not the case when a piezoelectric material with a different cut-angles is used as the piezoelectric layer 2. Here, "orthogonal" is not limited to being strictly orthogonal, but may be substantially perpendicular (an angle between the direction orthogonal to the length direction of the electrodes 3 and 4 and the polarization direction is, for example, about 90°±10°).

A support member 8 is laminated on the second main surface 2*b* side of the piezoelectric layer 2 with an insulating layer 7 interposed therebetween. The insulating layer 7 and the support member 8 have a frame shape and, as illustrated in FIG. 2, have cavities 7*a* and 8*a*. A hollow portion 9 is thereby formed. The hollow portion 9 is provided so as not to disturb the vibration of an excitation region C of the piezoelectric layer 2. Therefore, the support member 8 is laminated on the second main surface 2*b* with the insulating layer 7 interposed therebetween at a position not overlapping the portion where at least one pair of electrodes 3 and 4 is provided. Note that the insulating layer 7 does not necessarily need to be provided. Therefore, the support member 8 can be directly or indirectly laminated to the second main surface 2*b* of the piezoelectric layer 2.

The insulating layer 7 is preferably made of silicon oxide, for example. However, in addition to silicon oxide, appropriate insulating materials such as silicon oxynitride and alumina can be used. The support member 8 is made of Si. A plane orientation of the surface of Si on the piezoelectric layer 2 side may be (100), (110), or (111). Preferably, high-resistance Si having a resistivity of about 4 kΩ or more, for example, is desirable. However, the support member 8 can also be constructed using an appropriate insulating material or semiconductor material. Examples of materials for the support member 8 include piezoelectric materials such as aluminum oxide, lithium tantalate, lithium niobate, and quartz crystal, various ceramics such as alumina, magnesia, sapphire, silicon nitride, aluminum nitride, silicon carbide, zirconia, cordierite, mullite, steatite, and forsterite, dielectrics such as diamond and glass, and semiconductors such as gallium nitride.

The plurality of electrodes 3, 4 and the first and second busbars 5 and 6 are made of appropriate metals or alloys such as Al and AlCu alloys. In the present preferred embodiment, the electrodes 3 and 4 and the first and second busbars 5 and 6 have a structure in which an Al film is laminated on a Ti film. Note that an adhesion layer other than the Ti film may be used.

During driving, an AC voltage is applied between the multiple electrodes 3 and the multiple electrodes 4. More specifically, an AC voltage is applied between the first busbar 5 and the second busbar 6. As a result, it is possible to obtain resonance characteristics using a first-order thickness shear mode bulk waves excited in the piezoelectric layer 2.

In the acoustic wave device 1, d/p is about 0.5 or less, for example, where d is the thickness of the piezoelectric layer 2 and p is the center-to-center distance between adjacent electrodes 3 and 4 of any one of the plurality of pairs of electrodes 3 and 4. As a result, the first-order thickness shear mode bulk waves are effectively excited, and good resonance characteristics can be obtained. More preferably, d/p is about 0.24 or less, in which case even better resonance characteristics can be obtained.

When at least one of the electrodes 3 and 4 is plural as in the present preferred embodiment, that is, when the electrodes 3 and 4 form one pair of electrodes and there are 1.5 or more pairs of the electrodes 3 and 4, the center-to-center distance p between the adjacent electrodes 3 and 4 is the average distance between the center-to-center distances of the adjacent electrodes 3 and 4.

Since the acoustic wave device 1 of the present preferred embodiment has the above-described configuration, even when the number of pairs of the electrodes 3 and 4 is reduced in order to reduce the size, a Q value is less likely to decrease. This is because the resonator does not require reflectors on both sides, and a propagation loss is small. The reason why the above reflector is not required is that the first-order thickness shear mode bulk wave is used.

A difference between the Lamb wave used in the acoustic wave device of the related art and the first-order thickness shear mode bulk wave will be described with reference to FIGS. 3A and 3B.

Figure 3A:
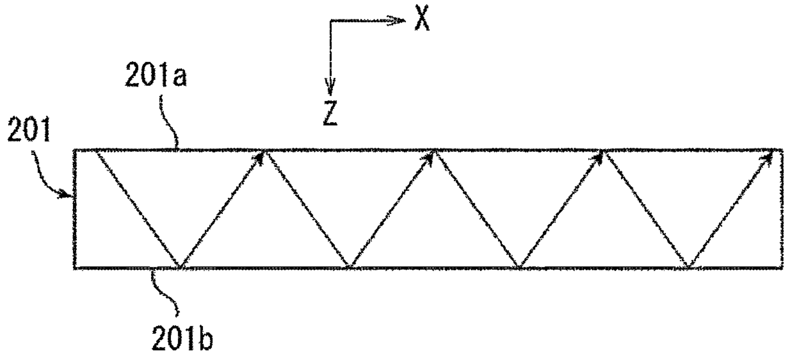
FIG. 3A is a schematic elevational sectional view for explaining Lamb waves propagating through a piezoelectric film of an acoustic wave device of the related art.

FIG. 3A is a schematic elevational sectional view for explaining Lamb waves propagating through a piezoelectric film of the acoustic wave device of the related art. The acoustic wave device of the related art is described, for example, in Japanese Unexamined Patent Application Publication No. 2012-257019. As illustrated in FIG. 3A, in the acoustic wave device of the related art, waves propagate through a piezoelectric film 201 as indicated by arrows. Here, in the piezoelectric film 201, a first main surface 201*a* and a second main surface 201*b* face each other, and a thickness direction connecting the first main surface 201*a* and the second main surface 201*b* is a Z direction. An X direction is a direction in which electrode fingers of the IDT electrodes are arrayed. As illustrated in FIG. 3A, in the Lamb wave, the wave propagates in the X direction as illustrated. Since it is a plate wave, although the piezoelectric film 201 as a whole vibrates, since the wave propagates in the X direction, reflectors are disposed on both sides to obtain resonance characteristics. Therefore, a wave propagation loss occurs, and the Q value decreases when reduction in the size of the acoustic wave device is attempted, that is, when the number of pairs of the electrode fingers is decreased.

Figure 3B:
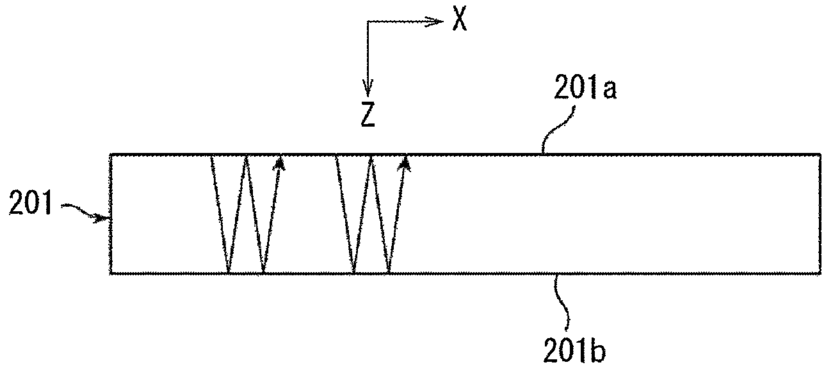
FIG. 3B is a schematic elevational sectional view for explaining waves of an acoustic wave device according to a preferred embodiment of the present invention.

Meanwhile, as illustrated in FIG. 3B, in the acoustic wave device 1 of the present preferred embodiment, since a vibration displacement is in a thickness shear direction, the wave propagates and resonates substantially in the direction connecting the first main surface 201*a* and the second main surface 201*b* of the piezoelectric layer 201, that is, in the Z direction. That is, an X-direction component of the wave is significantly smaller than a Z-direction component thereof. Further, since resonance characteristics are obtained by propagating waves in the Z direction, no reflector is required. Therefore, no propagation loss occurs when the waves propagate to the reflector. Therefore, even when the number of electrode pairs including the electrodes 3 and 4 is reduced in an attempt to reduce the size of the acoustic wave device, the Q value is less likely to decrease.

Figure 4:
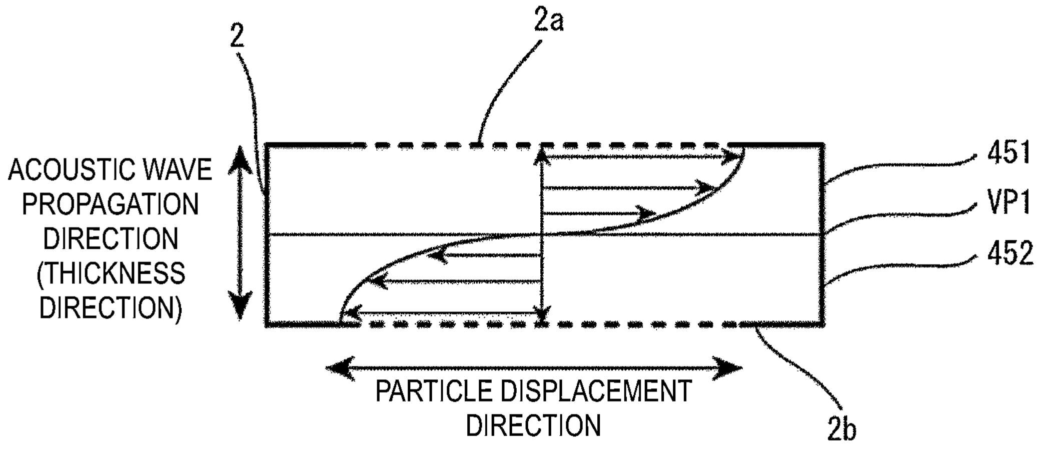
FIG. 4 is a schematic diagram illustrating a bulk wave when a voltage is applied between a first electrode and a second electrode so that a potential of the second electrode is higher than that of the first electrode.

Note that amplitude directions of the first-order thickness shear mode bulk waves are opposite to each other between a first region 451 included in the excitation region C of the piezoelectric layer 2 and a second region 452 included in the excitation region C of the piezoelectric layer 2, as illustrated in FIG. 4. FIG. 4 schematically illustrates bulk waves when a voltage is applied between the electrodes 3 and 4 such that the potential of the electrode 4 is higher than that of the electrode 3. The first region 451 is a region of the excitation region C between the first main surface 2*a* and a virtual plane VP1 that is orthogonal to the thickness direction of the piezoelectric layer 2 and bisects the piezoelectric layer 2. The second region 452 is a region of the excitation region C between the virtual plane VP1 and the second main surface 2*b*.

As described above, in the acoustic wave device 1, at least one pair of electrodes including the electrodes 3 and 4 is disposed. However, since waves are not propagated in the X direction, the number of electrode pairs including the electrodes 3 and 4 does not necessarily need to be plural. That is, it is sufficient that at least one pair of electrodes is provided.

For example, the electrode 3 is an electrode connected to a hot potential and the electrode 4 is an electrode connected to a ground potential. However, the electrode 3 may be connected to the ground potential and the electrode 4 may be connected to the hot potential. In the present preferred embodiment, at least one pair of electrodes is the electrode connected to the hot potential or the electrode connected to a ground potential, as described above, and no floating electrodes are provided.

Figure 5:
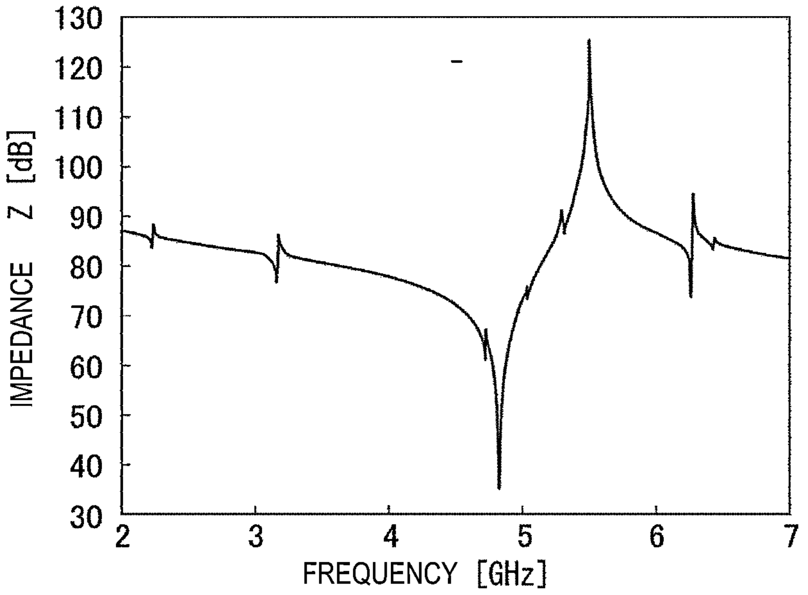
FIG. 5 is a diagram illustrating resonance characteristics of an acoustic wave device according to a first preferred embodiment of the present invention.

FIG. 5 is a diagram illustrating resonance characteristics of an acoustic wave device according to a first preferred embodiment of the present disclosure. The design parameters of the acoustic wave device 1 with the resonance characteristics are as follows.

Piezoelectric layer 2: $LiNbO_3$ with Euler angles (0°, 0°, 90°), thickness=400 nm.

When viewed in a direction orthogonal to the length direction of the electrodes 3 and 4, the length of the region where the electrodes 3 and 4 overlap, that is, the length of the excitation region C=about 40 μm, the number of pairs of electrodes including the electrodes 3 and 4=21 pairs, the center-to-center distance between the electrodes=about 3 μm, the width of the electrodes 3 and 4=about 500 nm, and d/p=about 0.133, for example.

Insulating layer 7: Silicon oxide film with a thickness of about 1 μm.

Support member 8: Si.

The length of the excitation region C is the dimension along the length direction of the electrodes 3 and 4 of the excitation region C.

In the present preferred embodiment, inter-electrode distances of an electrode pairs including the electrodes 3 and 4 are all equal in the plurality of pairs. That is, the electrodes 3 and 4 were disposed at equal pitches.

As is clear from FIG. 5, good resonance characteristics with a fractional bandwidth of about 12.5% are obtained in spite of having no reflector.

Assuming that the thickness of the piezoelectric layer 2 is d, and the center-to-center distance of the electrodes 3 and 4 is p, d/p is about 0.5 or less, more preferably about 0.24 or less in the present preferred embodiment, as described above. This will be explained with reference to FIG. 6.

Figure 6:
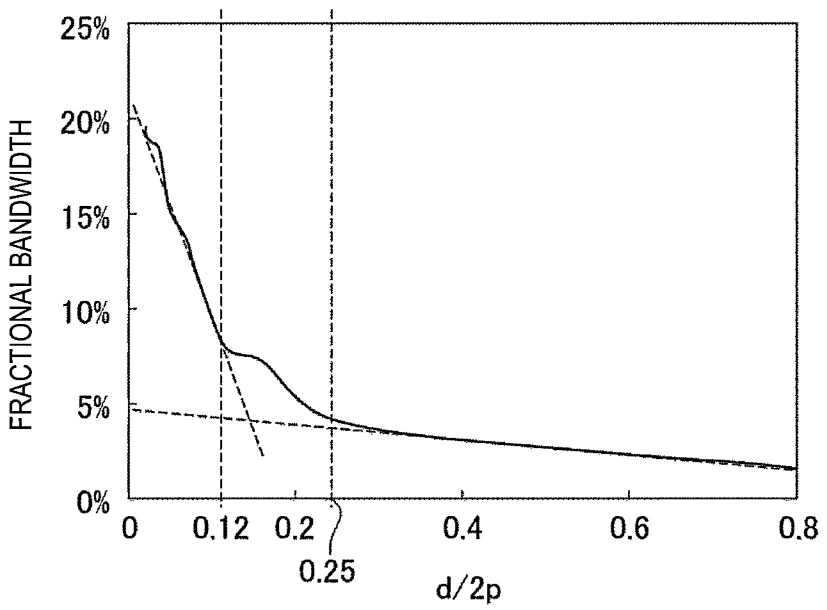
FIG. 6 is a diagram illustrating a relationship between d/2p and a fractional bandwidth as a resonator of the acoustic wave device.

A plurality of acoustic wave devices were obtained by changing d/2p in the same manner as the acoustic wave device that obtained the resonance characteristics illustrated in FIG. 5. FIG. 6 is a diagram illustrating a relationship between the d/2p and the fractional bandwidth as the resonator of the acoustic wave device.

As is clear from FIG. 6, when d/2p exceeds about 0.25, that is, when d/p>about 0.5, even when d/p is adjusted, the fractional bandwidth is less than about 5%, for example. Meanwhile, when d/2p≤about 0.25, that is, d/p≤about 0.5, the fractional bandwidth can be increased to about 5% or more by changing d/p within that range, for example, such that a resonator having a high coupling coefficient can be constructed. Further, when d/2p is about 0.12 or less, that is, when d/p is about 0.24 or less, the fractional bandwidth can be increased to about 7% or more, for example. In addition, by adjusting d/p within this range, a resonator with a wider fractional bandwidth can be obtained, and a resonator with a higher coupling coefficient can be realized. Therefore, by setting d/p to about 0.5 or less as in the acoustic wave device of the second aspect of a preferred embodiment of the present invention, for example, it is possible to configure a resonator having a high coupling coefficient using the first-order thickness shear mode bulk wave.

As described above, at least one pair of electrodes may be one pair, and p is the center-to-center distance between adjacent electrodes 3 and 4 in the case of one pair of electrodes. In the case of 1.5 pairs or more of electrodes, the average distance of the center-to-center distances of the adjacent electrodes 3 and 4 may be defined as p.

As for the thickness d of the piezoelectric layer, when the piezoelectric layer 2 has variations in thickness, a value obtained by averaging the thickness may be adopted.

Figure 7:
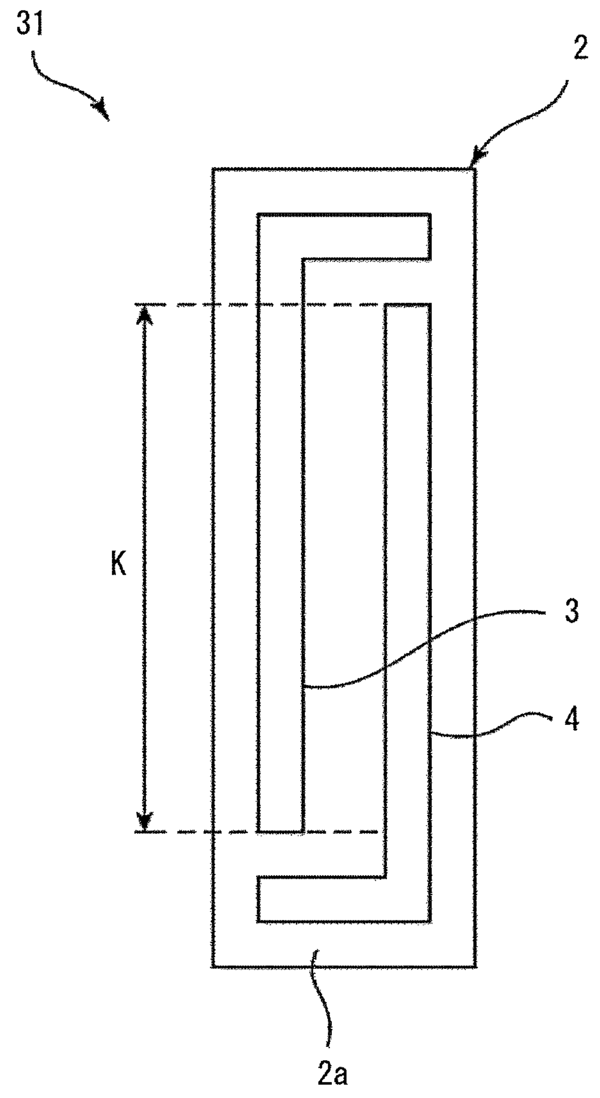
FIG. 7 is a plan view of another acoustic wave device according to the first preferred embodiment of the present invention.

FIG. 7 is a plan view of another acoustic wave device according to the first preferred embodiment of the present disclosure. In an acoustic wave device 31, a pair of electrodes having the electrode 3 and electrode 4 is provided on the first main surface 2*a* of the piezoelectric layer 2. Note that K in FIG. 7 is an intersecting width. As described above, in the acoustic wave device 31 of the present disclosure, the number of pairs of electrodes may be one. Even in this case, when the above d/p is about 0.5 or less, for example, it is possible to effectively excite the first-order thickness shear mode bulk wave.

In the acoustic wave device 1, preferably, in the plurality of electrodes 3 and 4, it is desirable that the metallization ratio MR of adjacent electrodes 3 and 4 with respect to the excitation region, which is the region where any of the adjacent electrodes 3 and 4 overlap each other when viewed in the facing direction, satisfies MR≤about 1.75(d/p)+0.075, for example. That is, the region in which one or more first electrode fingers and one or more second electrode fingers adjacent to each other overlap each other when viewed in the facing direction is the excitation region, and when the metallization ratio of the one or more first electrode fingers and the one or more second electrode fingers to the excitation region is MR, it is preferable that MR≤about 1.75 (d/p)+0.075 is satisfied, for example. In that case, spurious can be effectively reduced.

Figure 8:
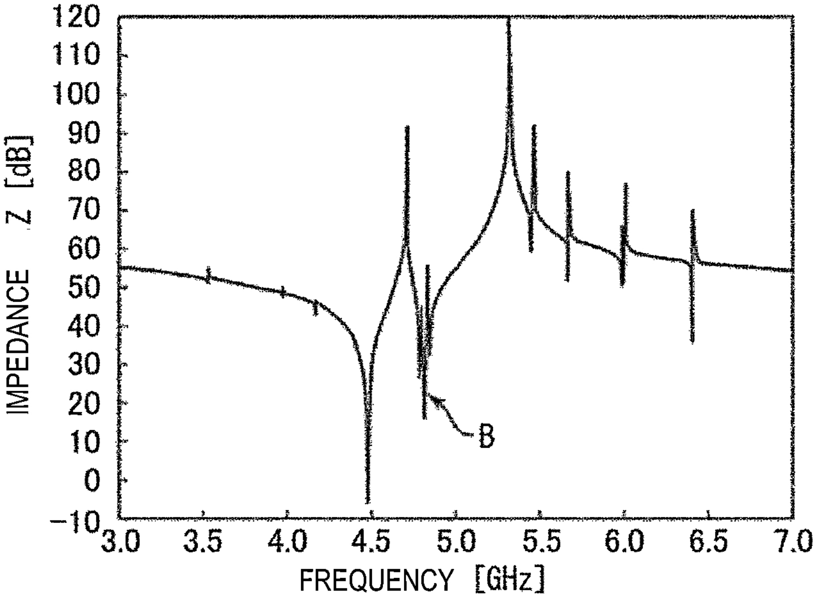
FIG. 8 is a reference diagram illustrating an example of resonance characteristics of an acoustic wave device.

This will be described with reference to FIGS. 8 and 9. FIG. 8 is a reference diagram illustrating an example of the resonance characteristics of the acoustic wave device 1. A spurious indicated by an arrow B appears between a resonant frequency and an anti-resonant frequency. Note that d/p=about 0.08 and the Euler angles of $LiNbO_3$ are (0°, 0°, 90°), for example. Also, the metallization ratio MR was set to about 0.35, for example.

The metallization ratio MR will be explained with reference to FIG. 1B. In the electrode structure of FIG. 1B, when focusing on the pair of electrodes 3 and 4, it is assumed that only the pair of electrodes 3 and 4 is provided. In this case, a portion surrounded by a dashed-dotted line C is the excitation region. When the electrodes 3 and 4 are viewed in the direction orthogonal to the length direction of the electrodes 3 and 4, that is, in the facing direction, the excitation region is a region where the electrode 3 overlaps the electrode 4, a region where the electrode 4 overlaps the electrode 3, and a region where the electrode 3 and the electrode 4 overlap each other in a region between the electrode 3 and the electrode 4. An area of the electrodes 3 and 4 in the excitation region C with respect to the area of this excitation region is the metallization ratio MR. That is, the metallization ratio MR is the ratio of the area of the metallization portion with respect to the area of the excitation region.

When the plurality of pairs of electrodes are provided, the ratio of the metallization portion included in the entire excitation region to the total area of the excitation region may be MR.

Figure 9:
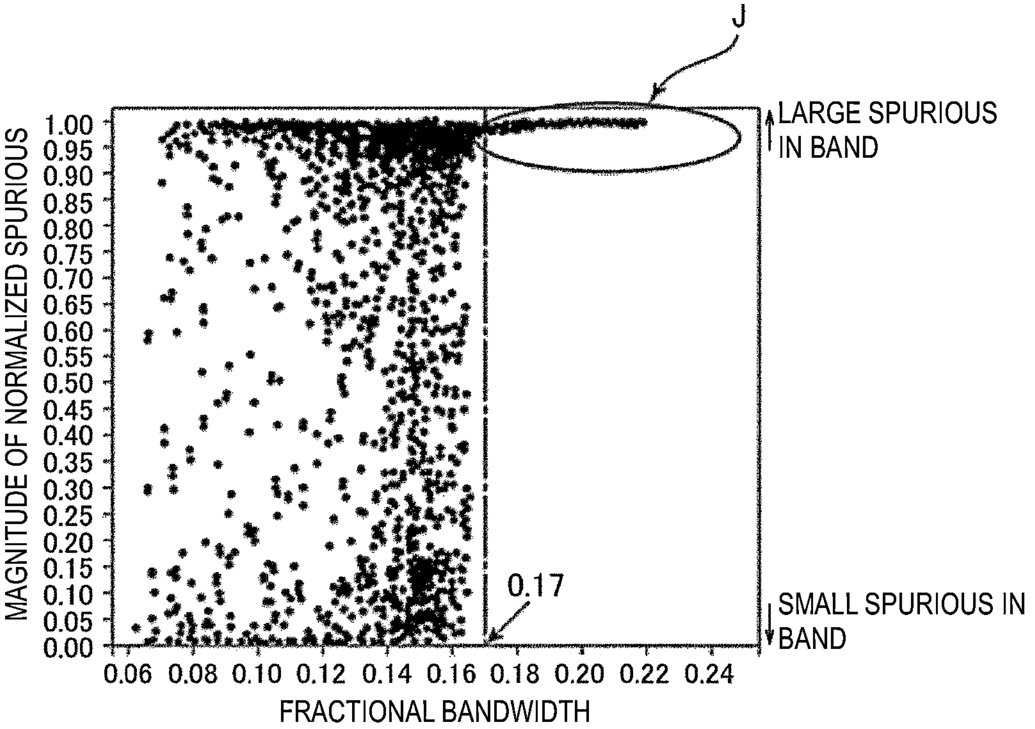
FIG. 9 is a diagram illustrating the relationship between a fractional bandwidth and a phase rotation amount of a spurious impedance normalized by 180 degrees as a magnitude of spurious when a large number of acoustic wave resonators are configured.

FIG. 9 is a diagram illustrating a relationship between the fractional bandwidth and a phase rotation amount of the spurious impedance normalized by 180 degrees as the magnitude of the spurious when a large number of acoustic wave resonators are configured according to the present preferred embodiment. The fractional bandwidth was adjusted by changing the film thickness of the piezoelectric layer and the dimensions of the electrodes. Moreover, FIG. 9 illustrates the results when a Z-cut $LiNbO_3$ piezoelectric layer is used, but the same tendency is obtained when piezoelectric layers with other cut-angles are used.

In a region surrounded by an ellipse J in FIG. 9, the spurious is as large as about 1.0, for example. As is clear from FIG. 9, when the fractional bandwidth exceeds about 0.17, that is, exceeds about 17%, for example, a large spurious with a spurious level of 1 or more appears in a pass band even when the parameters defining the fractional bandwidth are changed. That is, as in the resonance characteristics illustrated in FIG. 8, a large spurious indicated by an arrow B appears within the band. Therefore, the fractional bandwidth is preferably about 17% or less, for example. In this case, by adjusting the film thickness of the piezoelectric layer 2 and the dimensions of the electrodes 3 and 4, the spurious can be reduced.

Figure 10:
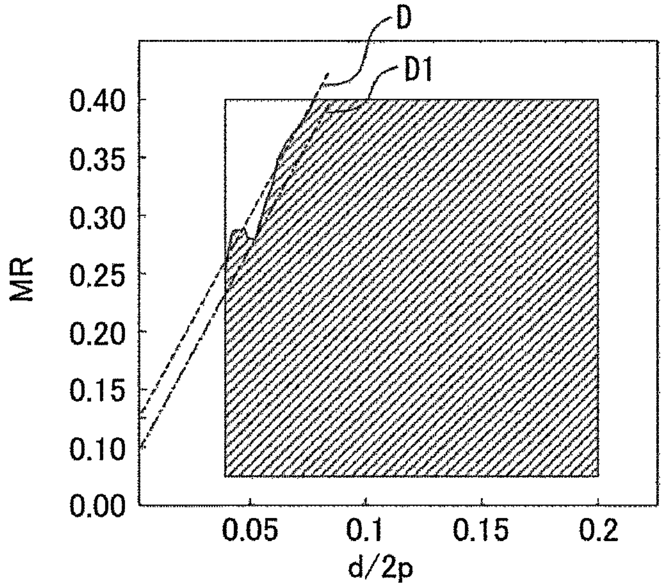
FIG. 10 is a diagram illustrating a relationship between d/2p, a metallization ratio MR, and a fractional bandwidth.

FIG. 10 is a diagram illustrating a relationship between d/2p, the metallization ratio MR, and the fractional bandwidth. In the acoustic wave device described above, various acoustic wave devices having different d/2p and MR were constructed, and the fractional bandwidth was measured. A hatched portion on a right side of a broken line D in FIG. 10 is the region where the fractional bandwidth is 17% or less. A boundary between the hatched region and the non-hatched region is expressed by MR=about 3.5(d/2p)+0.075, for example. That is, MR=about 1.75(d/p)+0.075. Therefore, preferably, MR≤about 1.75(d/p)+0.075, for example. In that case, it is easy to set the fractional bandwidth to about 17% or less, for example. It is more preferable a region on a right side of MR=about 3.5(d/2p)+0.05, for example, indicated by a dashed-dotted line D1 in FIG. 10. That is, when MR≤about 1.75(d/p)+0.05, the fractional bandwidth can be reliably reduced to about 17% or less, for example.

Figure 11:
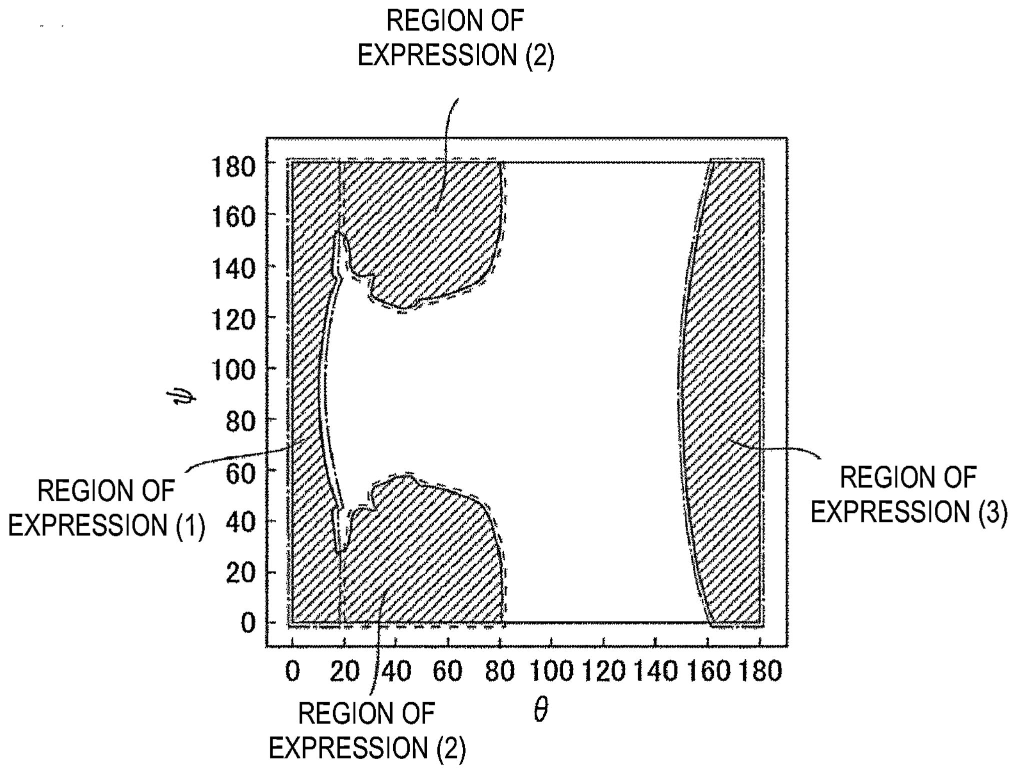
FIG. 11 is a diagram illustrating a map of a fractional bandwidth with respect to Euler angles (0°, θ, ψ) of $LiNbO_3$ when d/p is infinitely close to 0.

FIG. 11 is a diagram illustrating a map of the fractional bandwidth with respect to the Euler angles (0°, θ, ψ) of $LiNbO_3$ when d/p is infinitely close to 0. A hatched portion in FIG. 11 is a region where the fractional bandwidth of at least about 5% or more is obtained, for example, and the range of the region is approximated by the following Expressions (1), (2), and (3).

$$(0°\pm10°,\ 0°\text{ to }20°,\ \text{any }\psi) \qquad \text{Expression (1)}$$

$$(0°\pm10°,\ 20°\text{ to }80°,\ 0°\text{ to }60°(1-(\theta-50)^2/900)^{1/2})\text{ or }(0°\pm10°,\ 20°\text{ to }80°,\ [180°-60°(1-(\theta-50)^2/900)^{1/2}]\text{ to }180°) \qquad \text{Expression (2)}$$

$$(0°\pm10°,\ [180°-30°(1-(\psi-90)^2/8100)^{1/2}]\text{ to }180°,\ \text{any }\psi) \qquad \text{Expression (3)}$$

Therefore, in the case of the Euler angle range of Expression (1), Expression (2), or Expression (3), the fractional bandwidth can be sufficiently widened, which is preferable.

Figure 12:
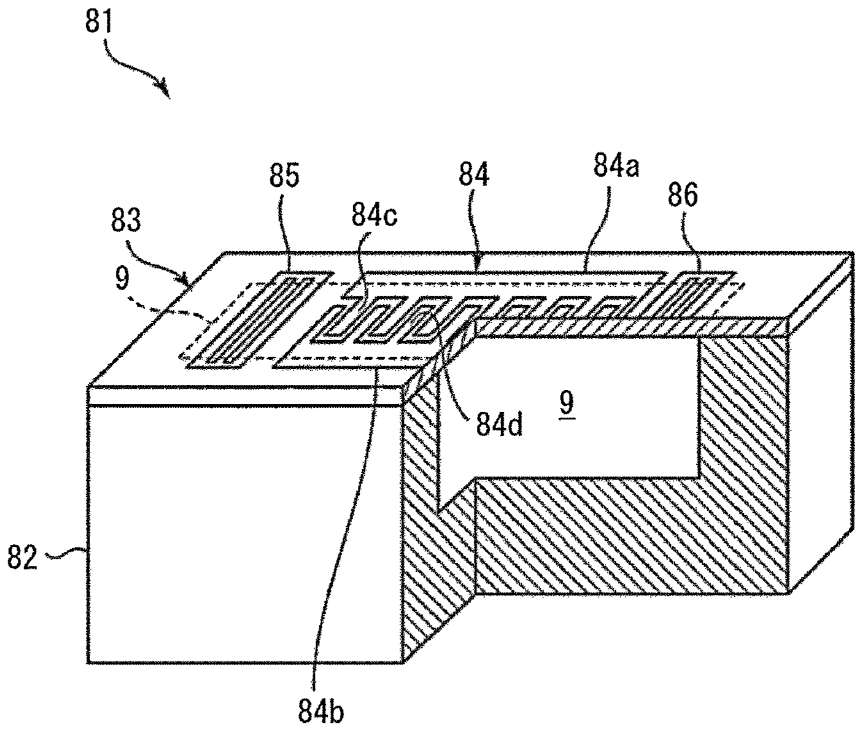
FIG. 12 is a partially cutaway perspective view for explaining the acoustic wave device according to the first preferred embodiment of the present invention.

FIG. 12 is a partially cutaway perspective view for explaining the acoustic wave device according to the first preferred embodiment of the present disclosure. An acoustic wave device 81 has a support substrate 82. The support substrate 82 is provided with a recessed portion that is open on an upper surface. A piezoelectric layer 83 is laminated on the support substrate 82. A hollow portion 9 is thereby formed. An IDT electrode 84 is provided on the piezoelectric layer 83 above the hollow portion 9. Reflectors 85 and 86 are provided on both sides of the IDT electrode 84 in an acoustic wave propagation direction. In FIG. 12, an outer periphery of the hollow portion 9 is indicated by broken lines. Here, the IDT electrode 84 has first and second busbars **84*a* and 84*b*, electrodes 84*c* as a plurality of first electrode fingers, and electrodes 84*d* as a plurality of second electrode fingers. The plurality of electrodes 84*c* are connected to the first busbar 84*a*. The plurality of electrodes 84*d* are connected to the second busbar 84*b*. The plurality of electrodes 84*c* and the plurality of electrodes 84*d*** are interdigitated with each other.

In the acoustic wave device 81, a Lamb wave as a plate wave is excited by applying an AC electric field to the IDT electrode 84 on the hollow portion 9. Since the reflectors 85 and 86 are provided on both sides, the resonance characteristics due to the Lamb wave can be obtained.

Second Preferred Embodiment

An acoustic wave device according to a second preferred embodiment of the present invention will be described. In the second preferred embodiment, descriptions of the details that overlap with those of the first preferred embodiment will be omitted as appropriate. In the second preferred embodiment, the details described in the first preferred embodiment can be applied.

Figure 13:
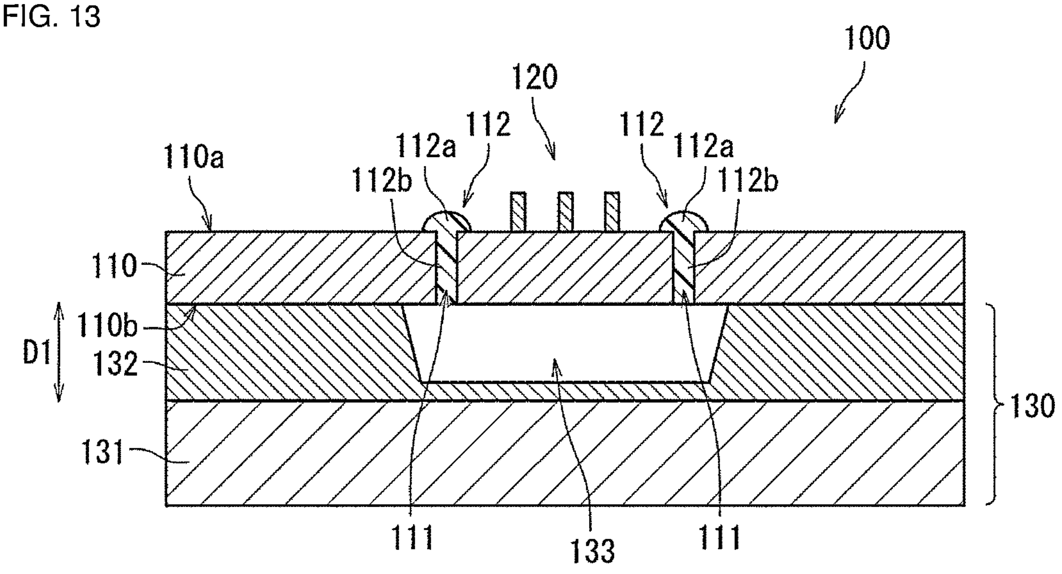
FIG. 13 is a schematic sectional view of an acoustic wave device according to a second preferred embodiment of the present invention.
Figure 14:
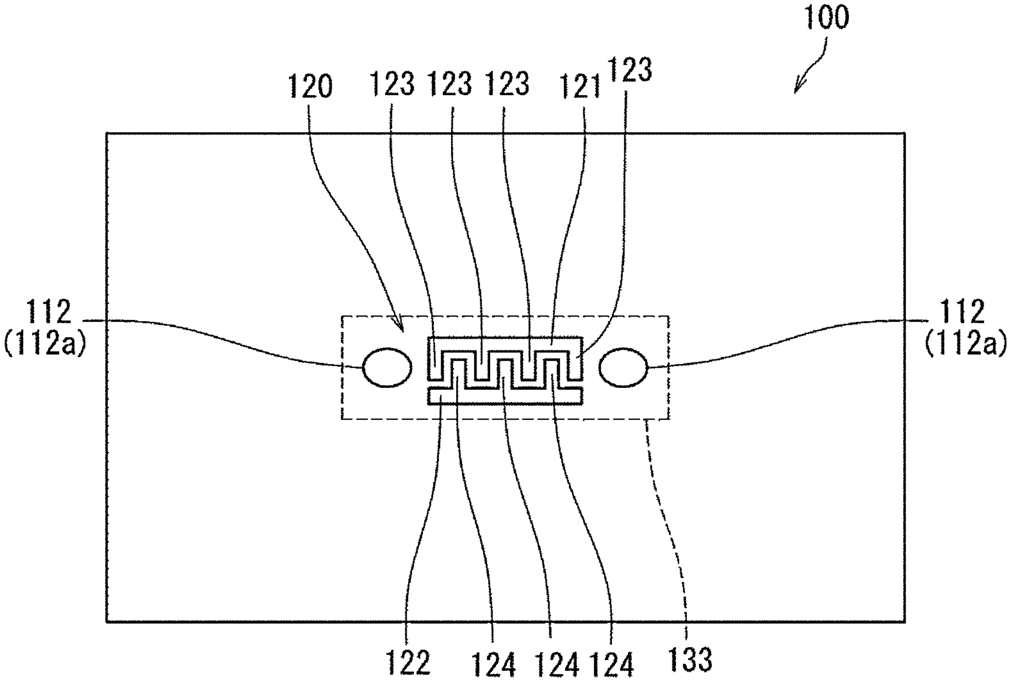
FIG. 14 is a schematic plan view of the acoustic wave device of FIG. 13.

FIG. 13 is a schematic sectional view of the acoustic wave device according to the second preferred embodiment of the present disclosure. FIG. 14 is a schematic plan view of the acoustic wave device of FIG. 13. As illustrated in FIGS. 13 and 14, an acoustic wave device 100 includes a piezoelectric layer 110, a functional electrode 120, and a support member 130.

The piezoelectric layer 110 has a first main surface **110*a* and a second main surface 110*b* opposite to the first main surface 110*a*. The functional electrode 120 is formed on the first main surface 110*a* of the piezoelectric layer 110. The support member 130 is provided on the second main surface 110*b* of the piezoelectric layer 110. The piezoelectric layer 110 is made of LiNbOx or LiTaOx, for example. In other words, the piezoelectric layer 110** is made of lithium niobate or lithium tantalate.

A dielectric film may be provided on the piezoelectric layer 110 so as to cover the functional electrode 120. Note that the dielectric film does not necessarily need to be provided.

The functional electrode 120 is an IDT electrode including a plurality of first electrode fingers 123, a plurality of second electrode fingers 124, a first busbar 121, and a second busbar 122, as illustrated in FIG. 14.

In the present preferred embodiment, the functional electrode 120 has the first busbar 121 and the second busbar 122 facing each other, the plurality of first electrode fingers 123 connected to the first busbar 121, and the plurality of second electrode fingers 124 connected to the second busbar 122. The plurality of first electrode fingers 123 and the plurality of second electrode fingers 124 are interdigitated with each other, and adjacent first electrode finger 123 and second electrode finger 124 form a pair of electrodes.

The support member 130 has a support substrate 131 made of Si. Further, in the present preferred embodiment, the support member 130 has an intermediate layer 132 made of SiOx. The intermediate layer 132 is laminated on the piezoelectric layer 110 side of the support member 130. That is, the support substrate 131 is disposed on the piezoelectric layer 110 with the intermediate layer 132 interposed therebetween. Note that the support member 130 only needs to have the support substrate 131 and does not have to have the intermediate layer 132.

The support member 130 is provided with a hollow portion 133 at a position overlapping at least a portion of the functional electrode 120 in plan view in the lamination direction (the direction of an arrow D1 in FIG. 13) of the support member 130 and the piezoelectric layer 110. In the intermediate layer 132, a recessed portion opening the surface opposite to the surface in contact with the support substrate 131 is provided. The hollow portion 133 is formed by covering the recessed portion with the piezoelectric layer 110. In the present preferred embodiment, the intermediate layer 132 of the support member 130 is provided with the hollow portion 133. The hollow portion 133 may be provided not only in the intermediate layer 132 but also in the support substrate 131. Alternatively, the hollow portion 133 may be provided in the support substrate 131.

The piezoelectric layer 110 is provided with a through hole 111 that communicates with the hollow portion 133 provided in the support member 130. In the present preferred embodiment, two through holes 111 communicating with the hollow portion 133 are provided. The number of through holes 111 is not limited to two, and may be one or three or more. The through holes 111 are disposed so as to interpose the functional electrode 120 in plan view.

Further, in the present preferred embodiment, the through hole 111 is disposed at a position overlapping the hollow portion 133 in plan view.

A reinforcing lid portion 112 that closes the through hole 111 is provided on the first main surface 110*a* of the piezoelectric layer 110. By disposing the reinforcing lid portion 112 in the through hole 111, the piezoelectric layer 110 can be reinforced and the generation of cracks or the like from the through hole 111 can be reduced or prevented. Therefore, mechanical strength of the piezoelectric layer 110 can be improved.

The reinforcing lid portion 112 is made of, for example, a material including resin such as polyimide or epoxy resin. As the resin forming the reinforcing lid portion 112, for example, a resin including a photosensitive material may be used. Further, the resin forming the reinforcing lid portion 112 may include a filler. When the resin includes a filler, viscosity of the resin is higher than when the resin does not include a filler, and the resin thus tends to remain in the through holes 111. Therefore, it is possible to reduce or prevent the resin from flowing into the hollow portion 133.

In the present preferred embodiment, the reinforcing lid portion 112 has a first reinforcing lid portion 112*a* disposed on the first main surface 110*a* of the piezoelectric layer 110 and a second reinforcing lid portion 112*b* disposed inside the through hole 111. In the example of FIG. 13, the second reinforcing lid portion 112*b* is disposed so as to close the entire through hole 111. The mechanical strength of the piezoelectric layer 110 can be further improved by disposing the second reinforcing lid portion 112*b* so as to close the entire through hole 111.

Figure 15:
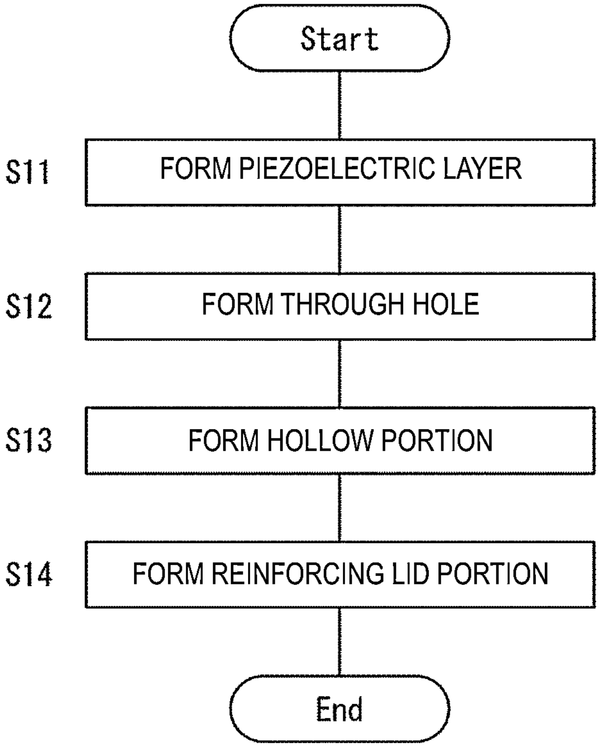
FIG. 15 is a flow chart illustrating a method of manufacturing an acoustic wave device.

FIG. 15 is a flow chart illustrating a non-limiting example of a method of manufacturing the acoustic wave device. FIGS. 16 to 23 are schematic sectional views illustrating a manufacturing process of the acoustic wave device. A method of manufacturing the acoustic wave device 100 will be described with reference to FIGS. 15 to 23.

Figure 16:
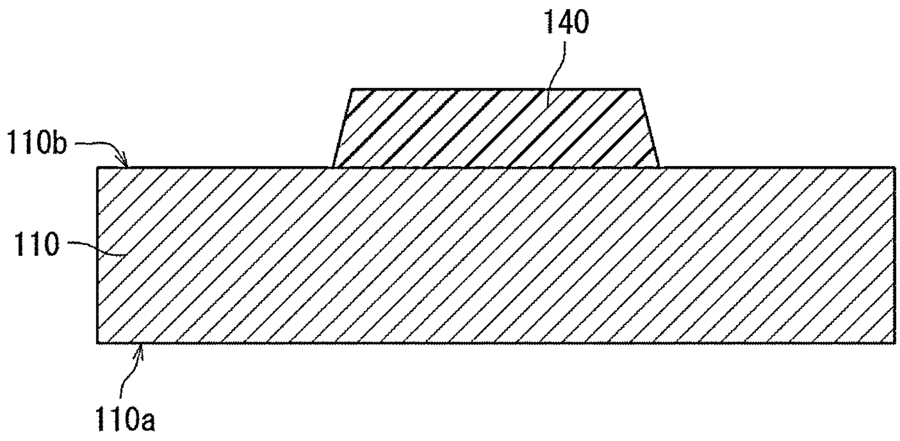
FIG. 16 is a schematic sectional view illustrating a manufacturing process of the acoustic wave device.
Figure 17:
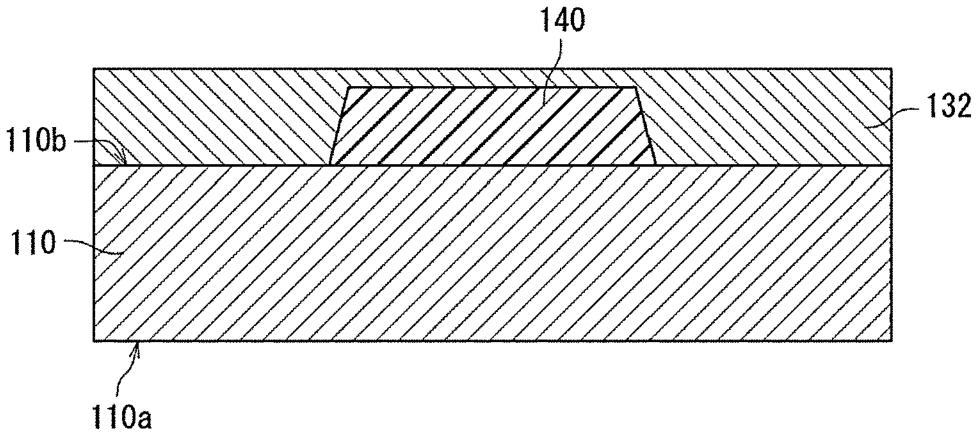
FIG. 17 is a schematic sectional view illustrating the manufacturing process of the acoustic wave device.
Figure 18:
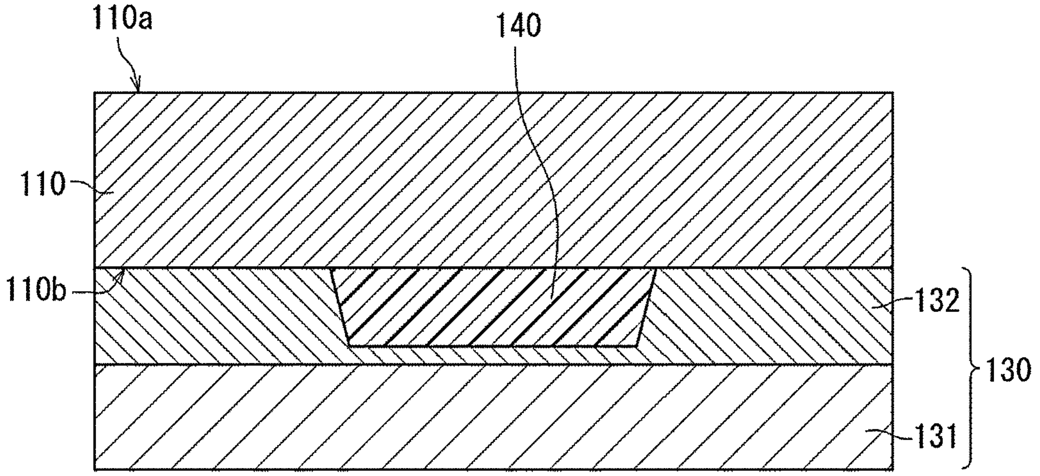
FIG. 18 is a schematic sectional view illustrating the manufacturing process of the acoustic wave device.
Figure 19:
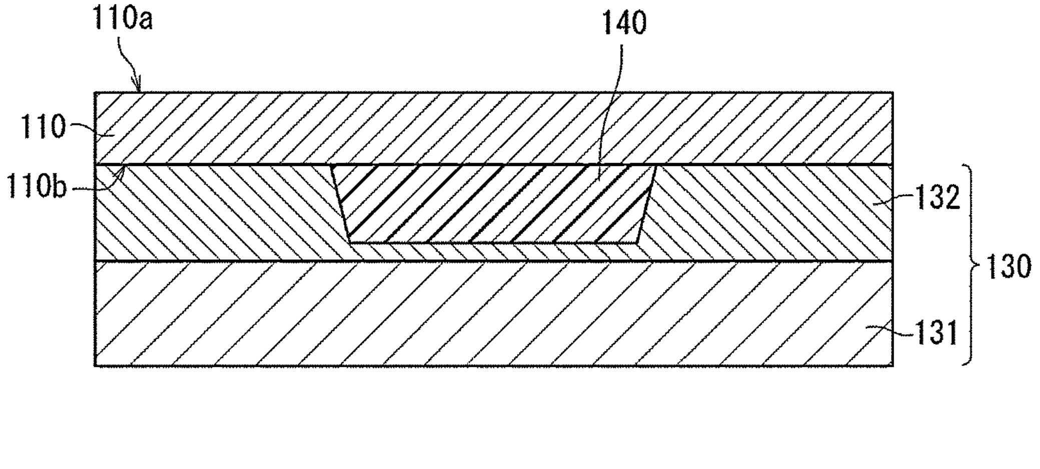
FIG. 19 is a schematic sectional view illustrating the manufacturing process of the acoustic wave device.
Figure 20:
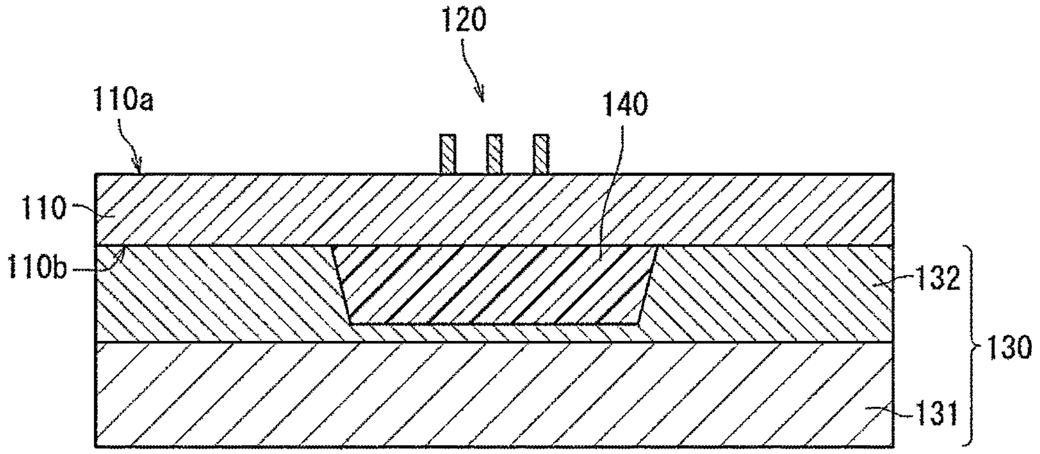
FIG. 20 is a schematic sectional view illustrating the manufacturing process of the acoustic wave device.

As illustrated in FIG. 15, the method of manufacturing the acoustic wave device 100 includes a piezoelectric layer forming step S11, a through hole forming step S12, a hollow portion forming step S13, and a reinforcing lid portion forming step S14. Each of the steps S11 to S14 is executed by a manufacturing device. In the step S11, the piezoelectric layer 110 is formed. Specifically, in the step S11, first, a sacrificial layer 140 is formed on the second main surface 110*b* of the piezoelectric layer 110, as illustrated in FIG. 16. The sacrificial layer 140 can be formed by forming a resist pattern and removing the resist after etching. Next, as illustrated in FIG. 17, the intermediate layer 132 is deposited. The intermediate layer 132 can be formed by forming a layer made of SiOx on the second main surface 110*b* of the piezoelectric layer 110 so as to cover the sacrificial layer 140, and planarizing the surface by grinding. Next, as illustrated in FIG. 18, the support substrate 131 is bonded to the surface of the intermediate layer 132. Next, as illustrated in FIG. 19, the piezoelectric layer 110 is thinned by grinding the first main surface 110*a* of the piezoelectric layer 110. As illustrated in FIG. 20, the functional electrode 120 is formed on the first main surface 110*a* of the piezoelectric layer 110 by lift-off.

Figure 21:
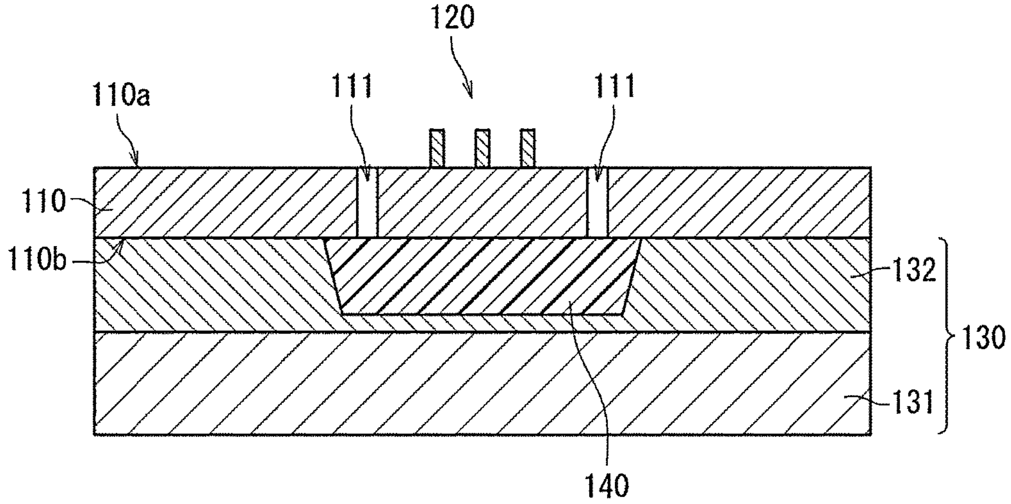
FIG. 21 is a schematic sectional view illustrating the manufacturing process of the acoustic wave device.

Next, in the step S12, the through hole 111 is formed. As illustrated in FIG. 21, the through hole 111 is formed through the piezoelectric layer 110 at a position overlapping the sacrificial layer 140 on the first main surface 110*a* of the piezoelectric layer 110 in plan view in the lamination direction of the support member 130 and the piezoelectric layer 110. In the present preferred embodiment, two through holes 111 are formed.

Figure 22:
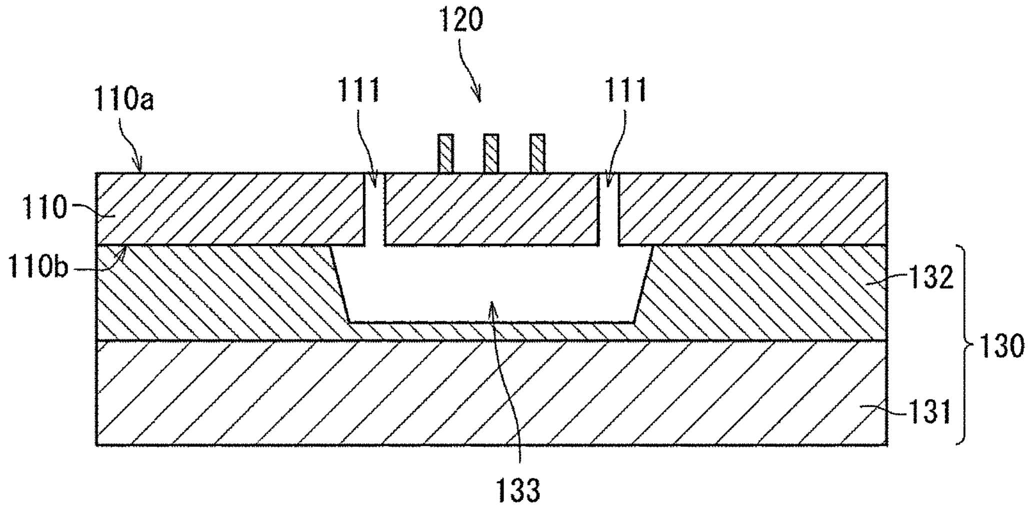
FIG. 22 is a schematic sectional view illustrating the manufacturing process of the acoustic wave device.

Next, in the step S13, the hollow portion 133 is formed. As illustrated in FIG. 22, the hollow portion 133 can be formed by etching the sacrificial layer 140 using the through holes 111.

Figure 23:
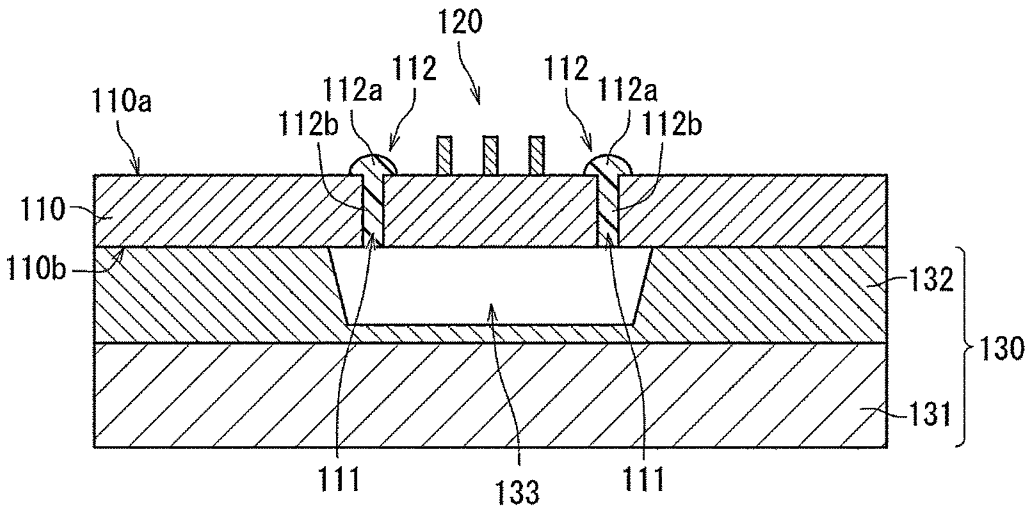
FIG. 23 is a schematic sectional view illustrating the manufacturing process of the acoustic wave device.

Next, in the step S14, the reinforcing lid portion 112 is formed. As illustrated in FIG. 23, a resin material including, for example, a photosensitive resin is applied to the positions of the first main surface 110*a* of the piezoelectric layer 110 at which the through holes 111 are closed, and the resin material is exposed, developed, and cured to form the reinforcing lid portion 112. The acoustic wave device 100 is completed by forming the reinforcing lid portion 112.

According to the acoustic wave device 100 of the present preferred embodiment, the piezoelectric layer 110, the functional electrode 120, and the support member 130 are provided. The piezoelectric layer 110 has the first main surface 110*a* and the second main surface 110*b* opposite to the first main surface 110*a*. The functional electrode 120 is formed on the first main surface 110*a* of the piezoelectric layer 110. The support member 130 is provided on the second main surface 110*b* of the piezoelectric layer 110 and has the support substrate 131. The support member 130 is provided with the hollow portion 133 at the position overlapping at least the functional electrode 120 in plan view in the lamination direction of the support member 130 and the piezoelectric layer 110. The through hole 111 communicating with the hollow portion 133 is formed in the piezoelectric layer 110. The reinforcing lid portion 112 that closes the through hole 111 is provided on the first main surface 110*a* of the piezoelectric layer 110.

With such a configuration, it is possible to provide the acoustic wave device 100 in which the mechanical strength of the piezoelectric layer 110 is improved. According to the acoustic wave device 100, since the reinforcing lid portion 112 is provided so as to close the through hole 111, cracks from the through hole 111 can be reduced or prevented and the mechanical strength of the piezoelectric layer 110 can be improved.

The reinforcing lid portion 112 has the first reinforcing lid portion 112*a* disposed on the first main surface 110*a*. Such a configuration can further improve the mechanical strength of the piezoelectric layer 110.

The reinforcing lid portion 112 has the second reinforcing lid portion 112*b* disposed at least partially inside the through hole 111. Such a configuration can further improve the mechanical strength of the piezoelectric layer 110.

The reinforcing lid portion 112 is made of a material including resin. The resin forming the reinforcing lid portion 112 includes a photosensitive material. With such a configuration, the reinforcing lid portion 112 can be easily formed. The resin forming the reinforcing lid portion 112 includes a filler. With such a configuration, it is possible to prevent the resin from entering the hollow portion 133 from the through hole 111.

The support member 130 has the intermediate layer 132 laminated on the piezoelectric layer 110 side. The hollow portion 133 is formed in the intermediate layer 132.

In addition, in the second preferred embodiment, an example in which the reinforcing lid portion 112 is formed of a material including resin has been described, but the material of the reinforcing lid portion 112 is not limited to this. The reinforcing lid portion 112 may be made of a material capable of closing the through hole 111, such as metal, ceramics, or rubber, for example.

The method of manufacturing the acoustic wave device 100 of the present preferred embodiment includes the piezoelectric layer forming step S11, the through hole forming step S12, the hollow portion forming step S13, and the reinforcing lid portion forming step S14. In the piezoelectric layer forming step S11, the support member 130 having the support substrate 131 is laminated on the piezoelectric layer 110 having the sacrificial layer 140 formed on the second main surface 110*b*, and the functional electrode 120 is formed on the first main surface 110*a* of the piezoelectric layer 110. In the through hole forming step S12, the through hole 111 extending through the piezoelectric layer 110 is formed at the position overlapping the sacrificial layer 140 of the piezoelectric layer 110 in plan view in the lamination direction of the support member 130 and the piezoelectric layer 110. In the hollow portion forming step S13, the sacrificial layer 140 is removed from the through hole 111 to form the hollow portion in the support member 130. In the reinforcing lid portion forming step S14, the reinforcing lid portion 112 that closes the through hole 111 is formed.

With such a configuration, it is possible to manufacture the acoustic wave device 100 in which the mechanical strength of the piezoelectric layer 110 is improved.

The reinforcing lid portion forming step includes applying a resin material including a photosensitive material to the positions of the first main surface 110*a* of the piezoelectric layer 110 at which the through holes 111 are closed, and exposing, developing, and curing the resin material. With such a configuration, formation of the reinforcing lid portion 112 can be facilitated.

In addition, in the second preferred embodiment, the example in which the functional electrode 120 is formed on the first main surface 110*a* of the piezoelectric layer 110 has been described, but the structure is not limited to this. The functional electrode 120 may be provided on the second main surface 110*b* of the piezoelectric layer 110.

A modification of the second preferred embodiment will be described below.

Modification 1

Figure 24:
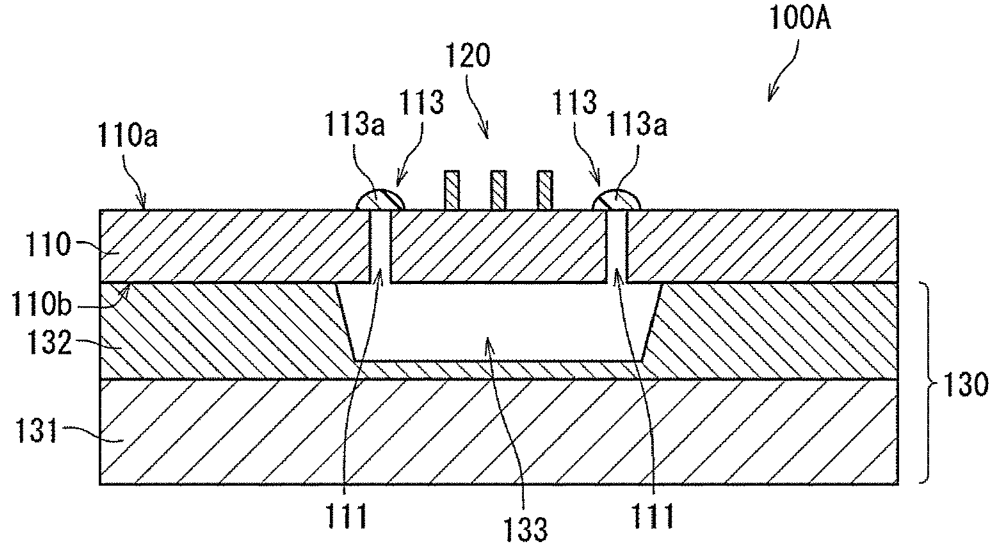
FIG. 24 is a schematic sectional view of an acoustic wave device of Modification 1 of a preferred embodiment of the present invention.

FIG. 24 is a schematic sectional view of an acoustic wave device of Modification 1 of a preferred embodiment of the present invention. As illustrated in FIG. 24, an acoustic wave device 100A is different from the second preferred embodiment in that the reinforcing lid portion 113 is not disposed in the through hole 111. In other words, in the acoustic wave device 100A, the first reinforcing lid portion 113*a* is disposed on the piezoelectric layer 110, but the second reinforcing lid portion is not disposed in the through hole 111.

In the acoustic wave device 100A, the reinforcing lid portion 113 has the first reinforcing lid portion 113*a* disposed on the first main surface 110*a* of the piezoelectric layer 110. The reinforcing lid portion 113 may be disposed to close the through hole 111 from the first main surface 110*a* of the piezoelectric layer 110.

Even in such a configuration, the mechanical strength of the piezoelectric layer 110 can be improved.

Modification 2

Figure 25:
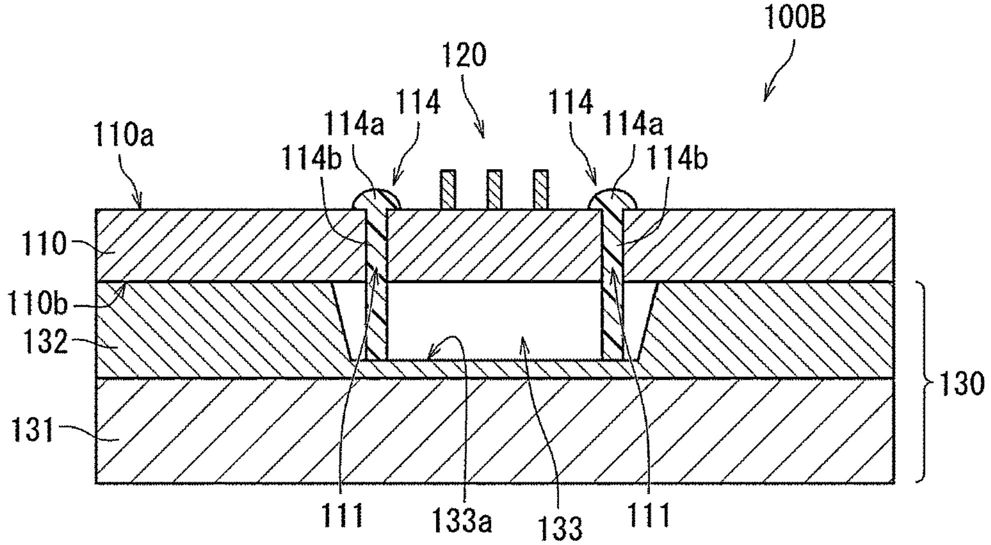
FIG. 25 is a schematic sectional view of an acoustic wave device of Modification 2 of a preferred embodiment of the present invention.

FIG. 25 is a schematic sectional view of an acoustic wave device of Modification 2 of a preferred embodiment of the present invention. As illustrated in FIG. 25, an acoustic wave device 100B is different from the acoustic wave device 100 of the second preferred embodiment in that a second reinforcing lid portion 114*b* extends to a bottom portion 133*a* of the hollow portion 133. In other words, the second reinforcing lid portion 114*b* reaches the bottom portion 133*a* of the hollow portion 133 provided in the intermediate layer 132.

The second reinforcing lid portion 114*b* is formed to extend from the through hole 111 to the bottom portion 133*a* of the hollow portion 133. Since the second reinforcing lid portion 114*b* is formed like a support supporting the piezoelectric layer 110 by being in contact with the bottom portion 133*a* of the hollow portion 133, the mechanical strength of the piezoelectric layer 110 can be further improved.

For example, by applying a liquid resin to the first main surface 110*a* of the piezoelectric layer 110 so as to close the through hole 111, the liquid resin hangs down from the through hole 111. By solidifying the hanging resin, the second reinforcing lid portion 114*b* extending from the through hole 111 to the bottom portion 133*a* of the hollow portion 133 can be formed.

Modification 3

Figure 26:
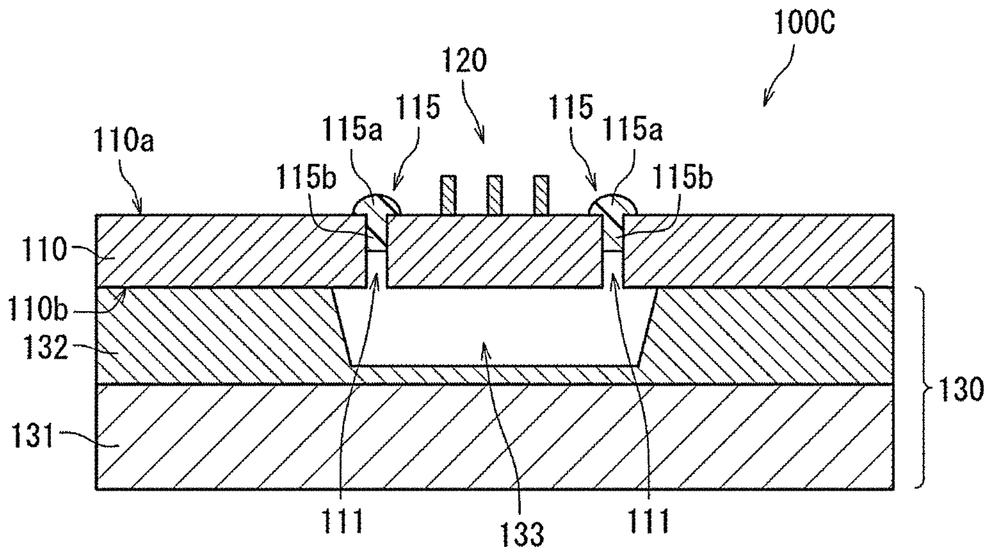
FIG. 26 is a schematic sectional view of an acoustic wave device of Modification 3 of a preferred embodiment of the present invention.

FIG. 26 is a schematic sectional view of an acoustic wave device of Modification 3 of a preferred embodiment of the present invention. As illustrated in FIG. 26, an acoustic wave device 100C is different from the second preferred embodiment in that the second reinforcing lid portion 115*b* is disposed in a portion of an inner portion of the through hole 111.

The mechanical strength of the piezoelectric layer 110 can be improved also when the second reinforcing lid portion 115*b* is not provided in the entirety of the through hole 111 but provided in a portion thereof. The second reinforcing lid portion 115*b* can be formed by applying an ink-like resin, for example.

Modification 4

Figure 27:
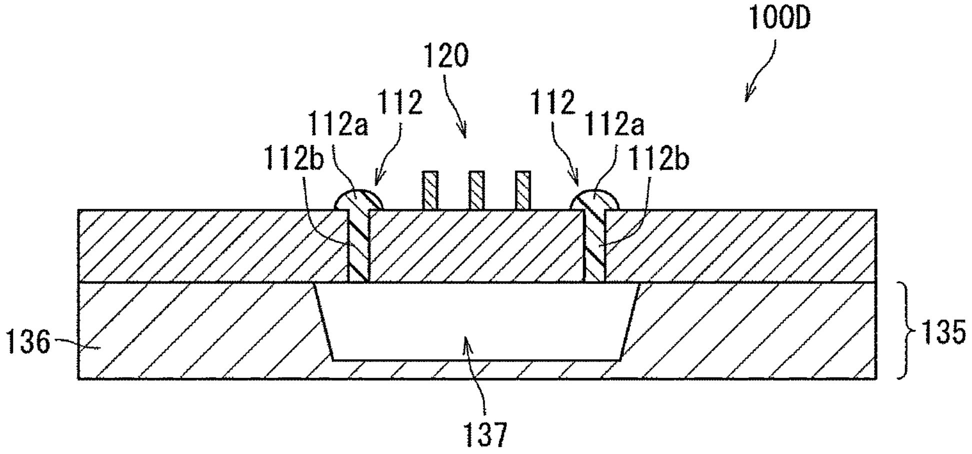
FIG. 27 is a schematic sectional view of an acoustic wave device of Modification 4 of a preferred embodiment of the present invention.

FIG. 27 is a schematic sectional view of an acoustic wave device of Modification 4 of a preferred embodiment of the present invention. As illustrated in FIG. 27, an acoustic wave device 100D is different from the second preferred embodiment in that a hollow portion 137 is formed in a support substrate 136.

In the acoustic wave device 100D, the support member 135 has the support substrate 136 and does not have the intermediate layer 132. In this case, the hollow portion 137 is formed in the support substrate 136.

Modification 5

Figure 28:
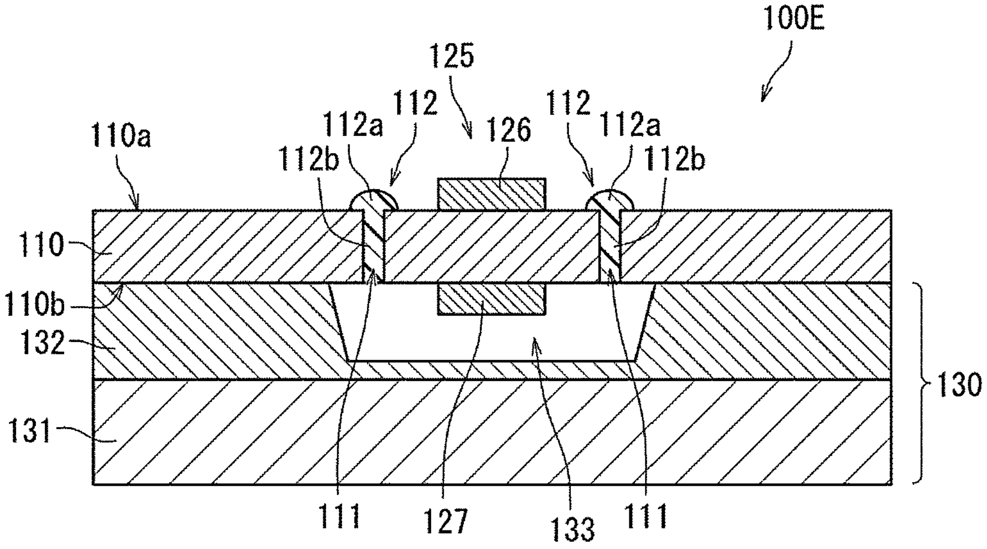
FIG. 28 is a schematic sectional view of an acoustic wave device of Modification 5 of a preferred embodiment of the present invention.

FIG. 28 is a schematic sectional view of an acoustic wave device of Modification 5 of a preferred embodiment of the present invention. As illustrated in FIG. 28, an acoustic wave device 100E is different from the second preferred embodiment in that a functional electrode 125 includes an upper electrode 126 and a lower electrode 127.

In the acoustic wave device 100E, the functional electrode 125 includes the upper electrode 126 and the lower electrode 127. The upper electrode 126 is provided on the first main surface 110*a* of the piezoelectric layer 110. The lower electrode 127 is provided on the second main surface 110*b* of the piezoelectric layer 110. In plan view in the lamination direction of the support member 130 and the piezoelectric layer 110, the upper electrode 126 and the lower electrode 127 have overlapping portions. In other words, at least a portion of the upper electrode 126 and a portion of the lower electrode 127 overlap in plan view.

The acoustic wave device 100E may be a bulk wave device including a bulk acoustic wave (BAW) element having the upper electrode 126 and the lower electrode 127 provided with the piezoelectric layer 110 interposed therebetween.

Third Preferred Embodiment

An acoustic wave device according to a third preferred embodiment of the present invention will be described. In the third preferred embodiment, descriptions of the details overlapping those of the first and second preferred embodiments will be omitted as appropriate. The details described in the first and second preferred embodiments can be applied to the third preferred embodiment.

Figure 29:
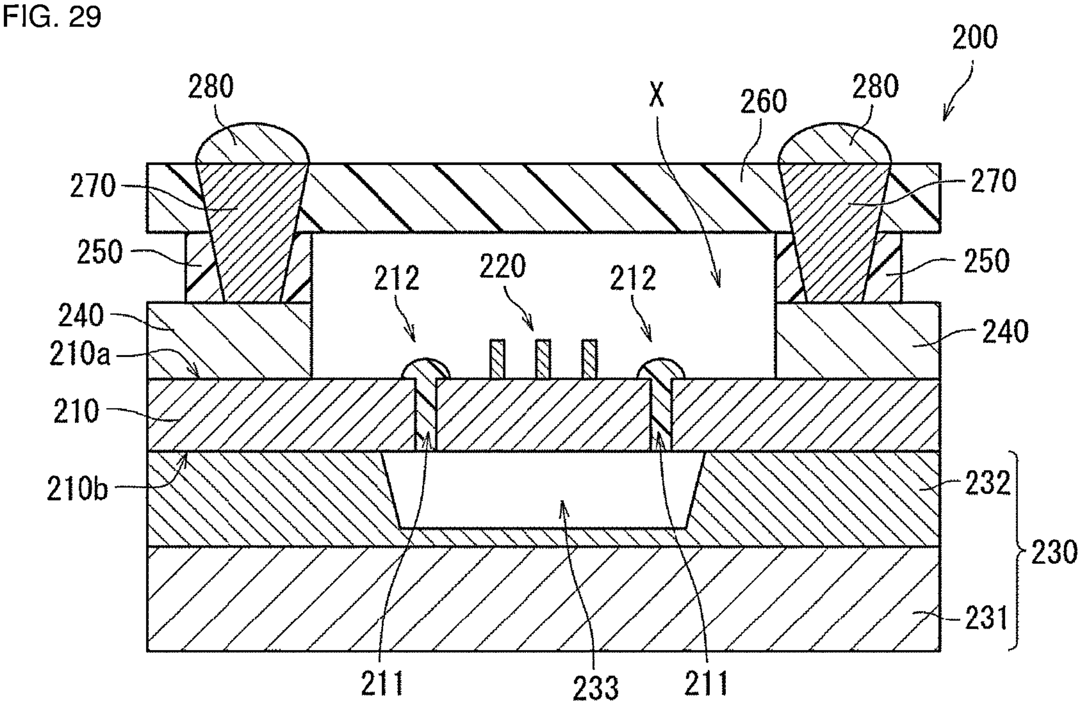
FIG. 29 is a schematic sectional view of an acoustic wave device according to a third preferred embodiment of the present invention.
Figure 30:
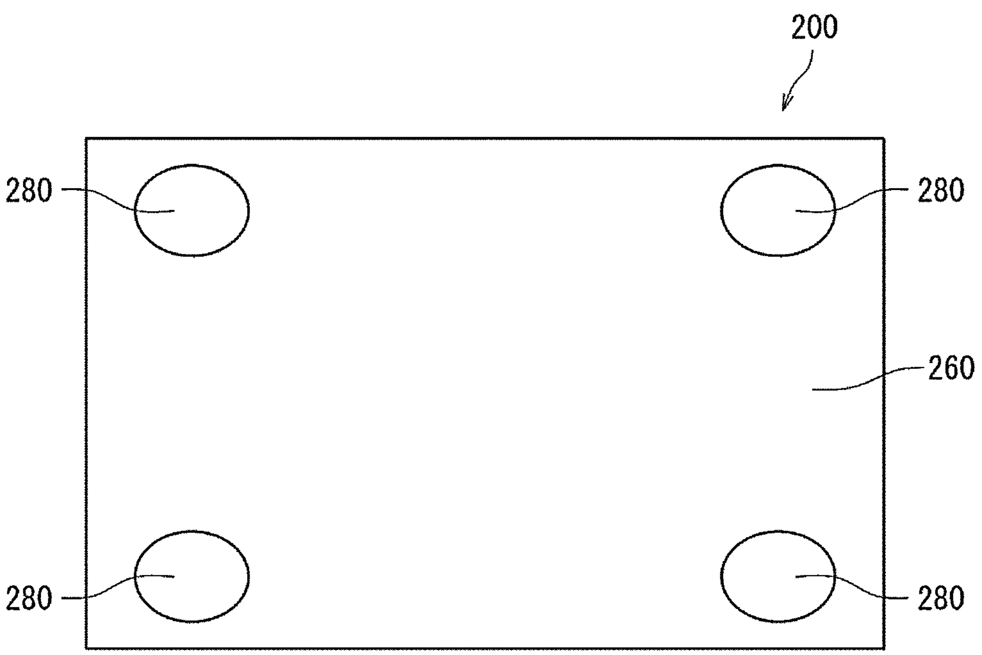
FIG. 30 is a schematic plan view of the acoustic wave device of FIG. 29.
Figure 31:
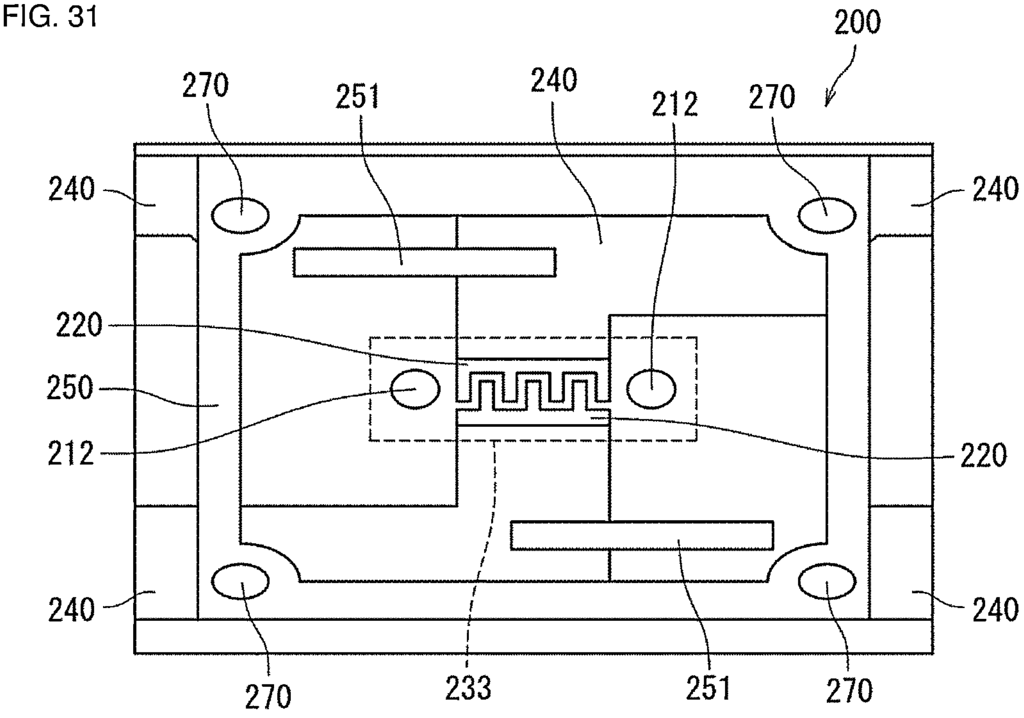
FIG. 31 is a schematic plan view of the acoustic wave device of FIG. 29 excluding a lid member.
Figure 32:
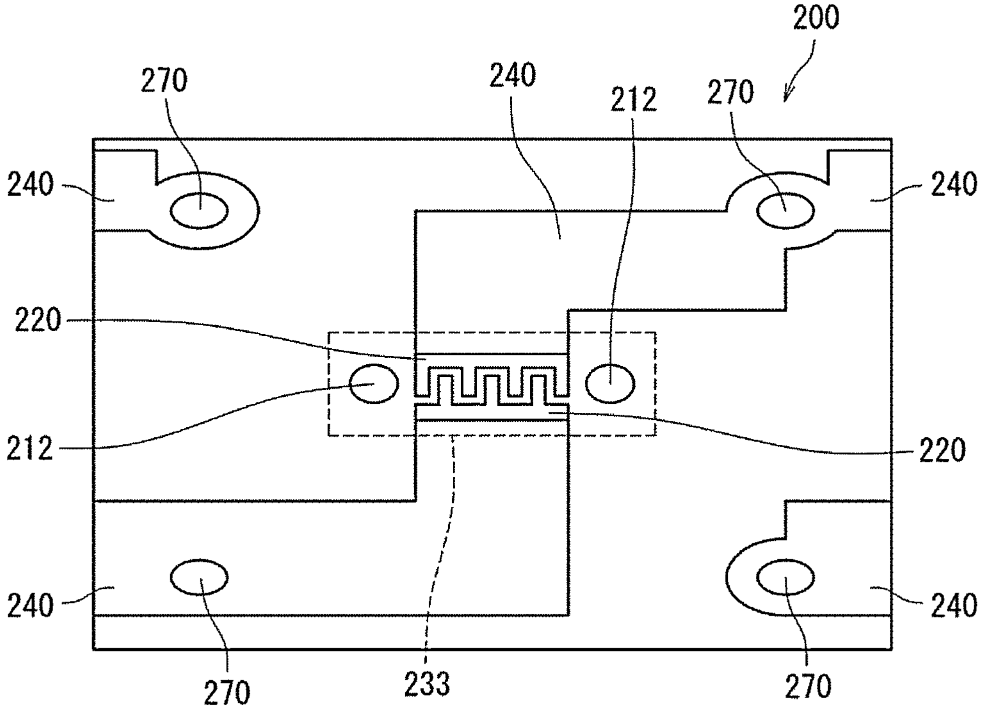
FIG. 32 is a schematic plan view of the acoustic wave device of FIG. 29 excluding the lid member and support.

FIG. 29 is a schematic sectional view of the acoustic wave device according to the third preferred embodiment of the present disclosure. FIG. 30 is a schematic plan view of the acoustic wave device of FIG. 29. FIG. 31 is a schematic plan view of the acoustic wave device of FIG. 29 excluding a lid member. FIG. 32 is a schematic plan view of the acoustic wave device of FIG. 29 excluding the lid member and the support. As illustrated in FIGS. 29 to 32, an acoustic wave device 200 is a device having a wafer level package (WLP) structure including wiring electrodes 240, a support 250, a lid member 260, under-bump metals 270, and bumps 280. Having the WLP structure of the acoustic wave device 200 makes it easy to mount the acoustic wave device 200 on a module.

In the acoustic wave device 200, as illustrated in FIGS. 29 to 32, a functional electrode 220 is formed on a first main surface 210*a* of a piezoelectric layer 210, and a support member 230 is laminated on a second main surface 210*b*. The support member 230 includes a support substrate 231 and an intermediate layer 232. A hollow portion 233 is provided in the intermediate layer 232. The piezoelectric layer 210 is provided with a through hole 211 that communicates with the hollow portion 233. A reinforcing lid portion 212 that closes the through hole 211 is disposed on the first main surface 210*a* of the piezoelectric layer.

Furthermore, the wiring electrode 240 connected to the functional electrodes 220 is formed on the first main surface 210*a* of the piezoelectric layer 210.

The support 250 is provided on the first main surface 210*a* of the piezoelectric layer 210. The support 250 is disposed so as to surround the functional electrode 220 in plan view in a lamination direction of the support member 230 and the piezoelectric layer 210. As illustrated in FIG. 31, at least a portion of the support 250 is disposed to overlap the wiring electrode 240 in plan view. Also, in plan view, an internal reinforcing support frame 251 may be disposed at a position surrounded by the support 250. For example, the support 250 and the internal reinforcing support frame 251 are made of an appropriate insulating material such as a synthetic resin.

The lid member 260 is disposed on the support 250. The lid member 260 is fixed to support 250 so as to close the cavity of the support 250. By disposing the support 250 and the lid member 260, a hollow section X is formed at a position overlapping the functional electrode 220 in plan view. The lid member 260 is made of, for example, resin or Si.

The under-bump metal 270 electrically connected to the wiring electrode 240 is disposed on the support 250 and the lid member 260. The under-bump metal 270 is disposed to extend through the support 250 and the lid member 260. Specifically, the under-bump metal is disposed inside a terminal hole provided to extend through the support 250 and the lid member 260.

The metal bump 280 is connected to the under-bump metal 270. The acoustic wave device 200 is provided with a plurality of bumps 280, and as illustrated in FIG. 30, the respective bumps 280 are disposed regularly in a lattice, for example, to form a ball grid array (BGA). The bump 280 is electrically connected to the wiring electrode 240 with the under-bump metal 270 interposed therebetween.

Figure 33:
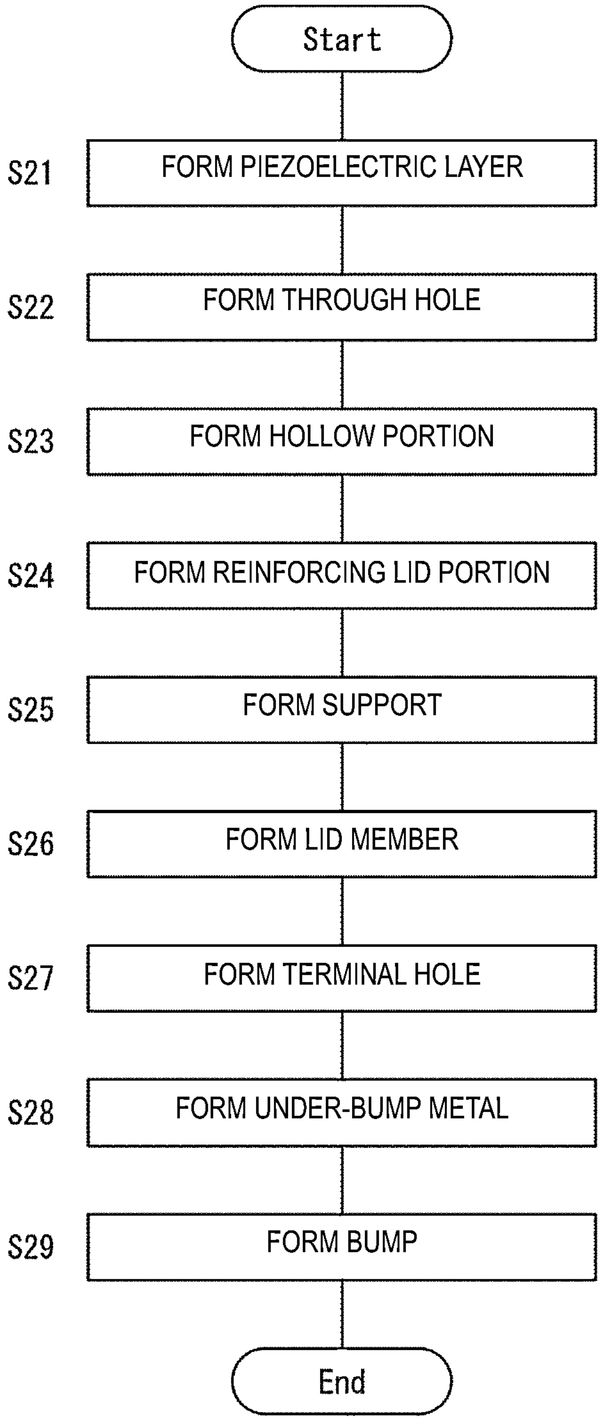
FIG. 33 is a flow chart illustrating a method of manufacturing an acoustic wave device.

FIG. 33 is a flow chart illustrating a method of manufacturing the acoustic wave device. FIGS. 34 to 46 are schematic sectional views illustrating a manufacturing process of the acoustic wave device. The method of manufacturing the acoustic wave device 200 will be described with reference to FIGS. 33 to 46.

As illustrated in FIG. 33, the method of manufacturing the acoustic wave device 200 includes a piezoelectric layer forming step S21, a through hole forming step S22, a hollow portion forming step S23, and a reinforcing lid portion forming step S24. The method of manufacturing the acoustic wave device 200 further includes a support forming step S25, a lid member forming step S26, a terminal hole forming step S27, an under-bump metal forming step S28, and a bump forming step S29. Each of the steps S21 to S29 is executed by a manufacturing device.

Figure 34:
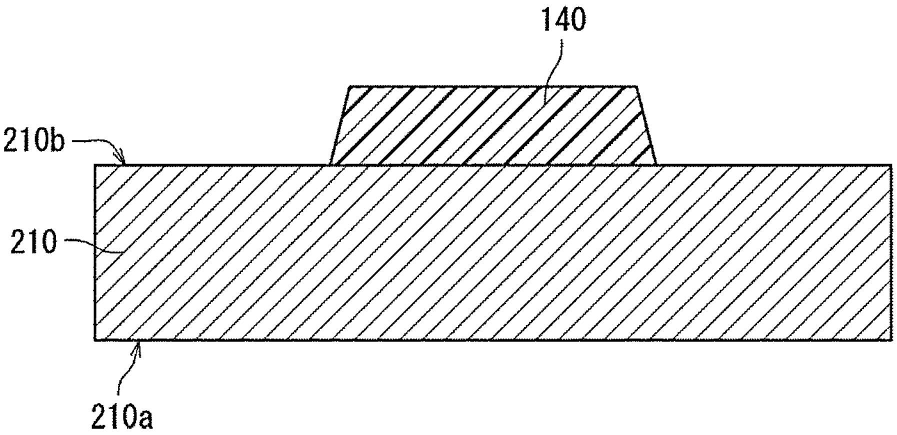
FIG. 34 is a schematic sectional view illustrating a manufacturing process of the acoustic wave device.
Figure 35:
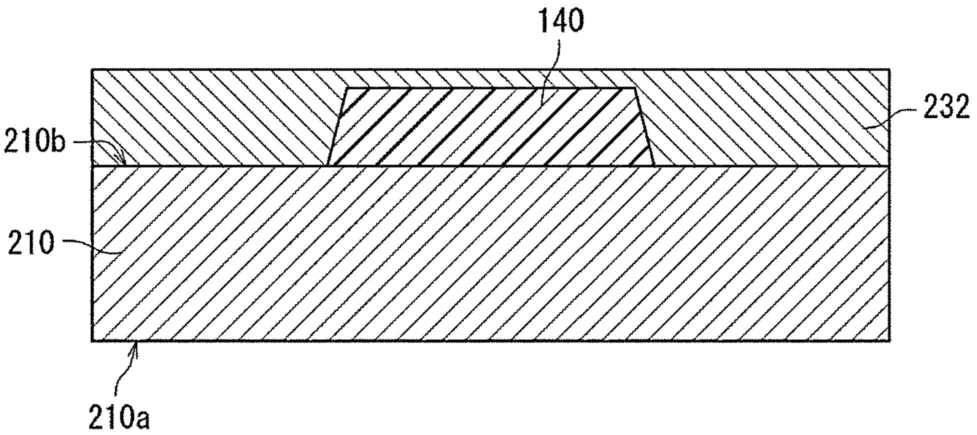
FIG. 35 is a schematic sectional view illustrating the manufacturing process of the acoustic wave device.
Figure 36:
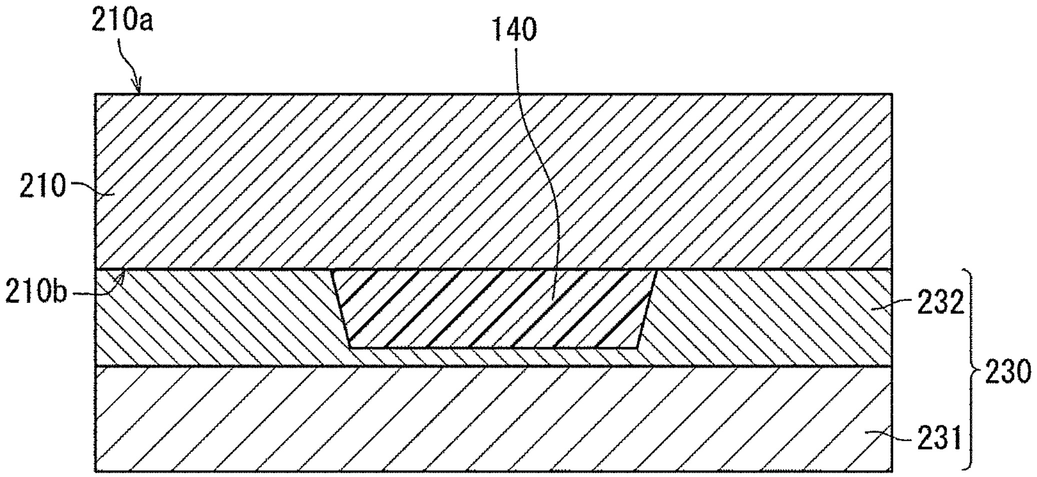
FIG. 36 is a schematic sectional view illustrating the manufacturing process of the acoustic wave device.
Figure 37:
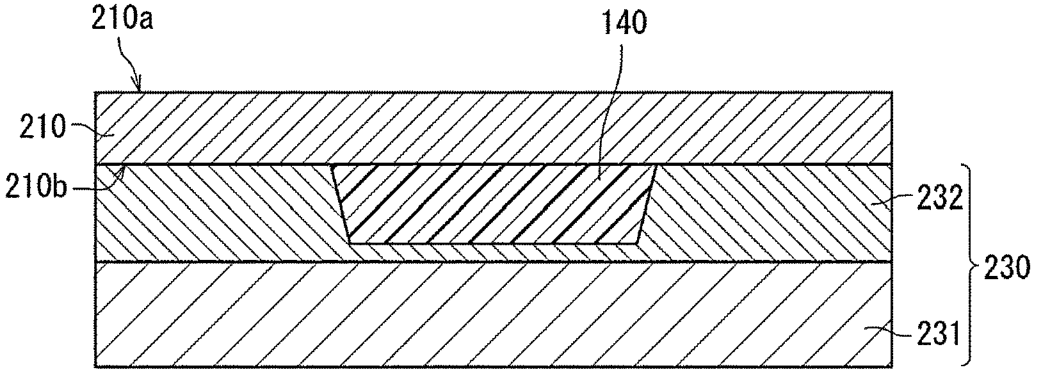
FIG. 37 is a schematic sectional view illustrating the manufacturing process of the acoustic wave device.
Figure 38:
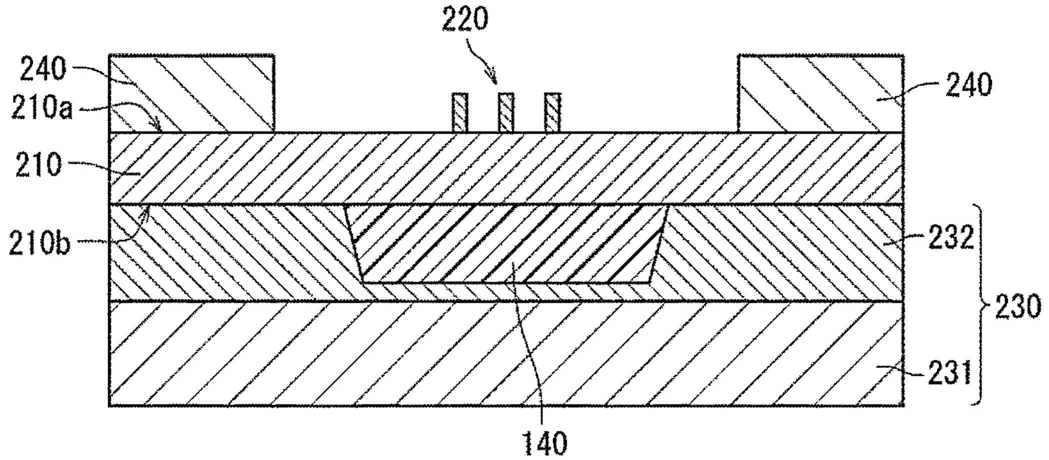
FIG. 38 is a schematic sectional view illustrating the manufacturing process of the acoustic wave device.

The piezoelectric layer 210 is formed. Specifically, in the step S21, first, the sacrificial layer 140 is formed on the second main surface 210*b* of the piezoelectric layer 210, as illustrated in FIG. 34. The sacrificial layer 140 can be formed by forming a resist pattern and removing the resist after etching. Next, as illustrated in FIG. 35, the intermediate layer 232 is deposited. The intermediate layer 232 can be formed by forming a layer made of SiOx on the second main surface 210*b* of the piezoelectric layer 210 so as to cover the sacrificial layer 140, and planarizing the surface by grinding. Next, as illustrated in FIG. 36, the support substrate 231 is bonded to the surface of the intermediate layer 232. Next, as illustrated in FIG. 37, the piezoelectric layer 210 is thinned by grinding the first main surface 210*a* of the piezoelectric layer 210. The functional electrode 220 is formed on the first main surface 210*a* of the piezoelectric layer 210 by lift-off. At this time, as illustrated in FIG. 38, the wiring electrode 240 electrically connected to the functional electrode 220 is also formed on the first main surface 210*a* of the piezoelectric layer 210. The wiring electrode 240 can also be formed by lift-off.

Figure 39:
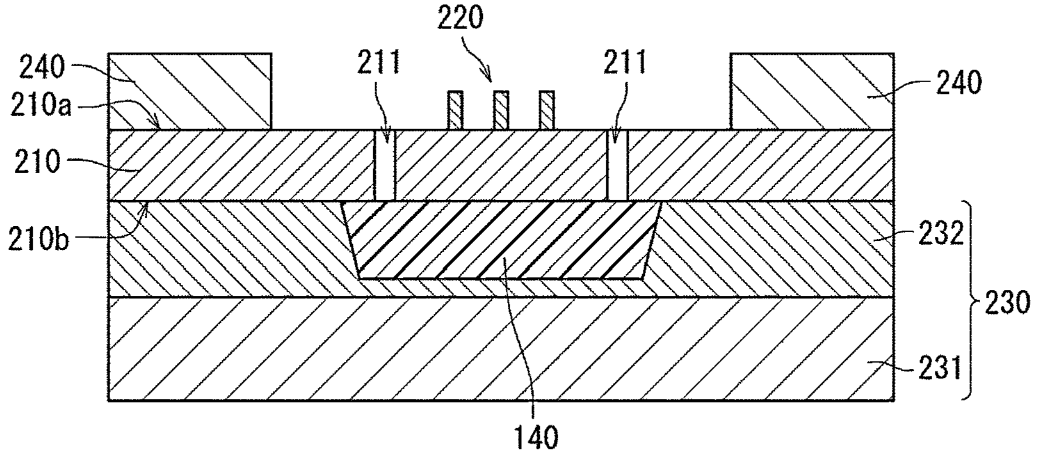
FIG. 39 is a schematic sectional view illustrating the manufacturing process of the acoustic wave device.

Next, in the step S22, the through hole 211 is formed. As illustrated in FIG. 39, a through hole 211 is formed through the piezoelectric layer 210 at a position overlapping the sacrificial layer 140 on the first main surface 210*a* of the piezoelectric layer 210 in plan view in the lamination direction of the support member 230 and the piezoelectric layer 210. In the present preferred embodiment, two through holes 211 are formed.

Figure 40:
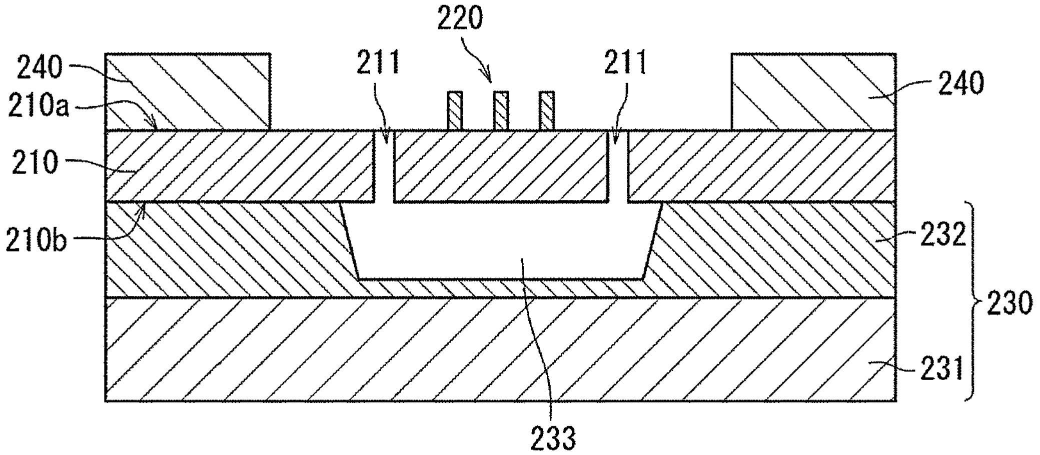
FIG. 40 is a schematic sectional view illustrating the manufacturing process of the acoustic wave device.

Next, in the step S23, the hollow portion 233 is formed. As illustrated in FIG. 40, the hollow portion 233 can be formed by etching the sacrificial layer 140 using the through holes 211.

Figure 41:
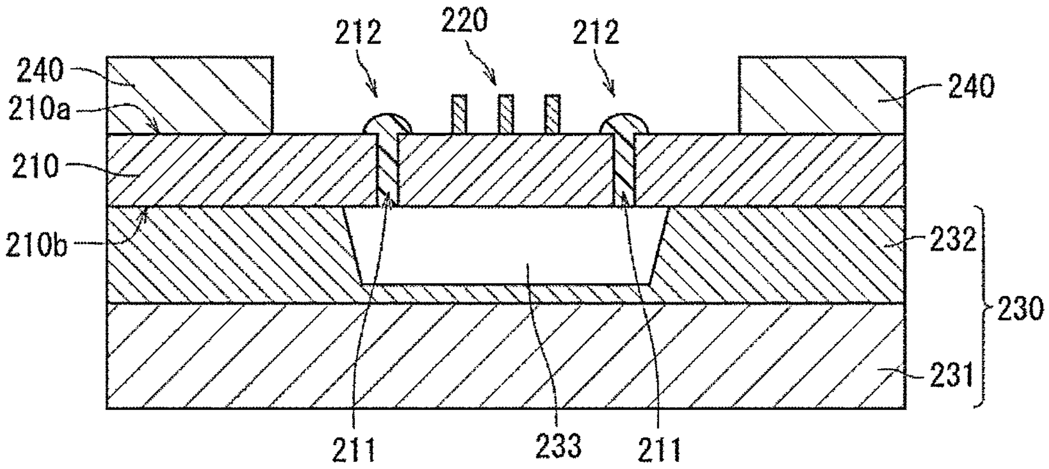
FIG. 41 is a schematic sectional view illustrating the manufacturing process of the acoustic wave device.

Next, in the step S24, the reinforcing lid portion 212 is formed. As illustrated in FIG. 41, a resin material including, for example, a photosensitive resin is applied to the positions of the first main surface 210*a* of the piezoelectric layer 210 at which the through holes 211 are closed, and the resin material is exposed, developed, and cured to form the reinforcing lid portion 212.

Figure 42:
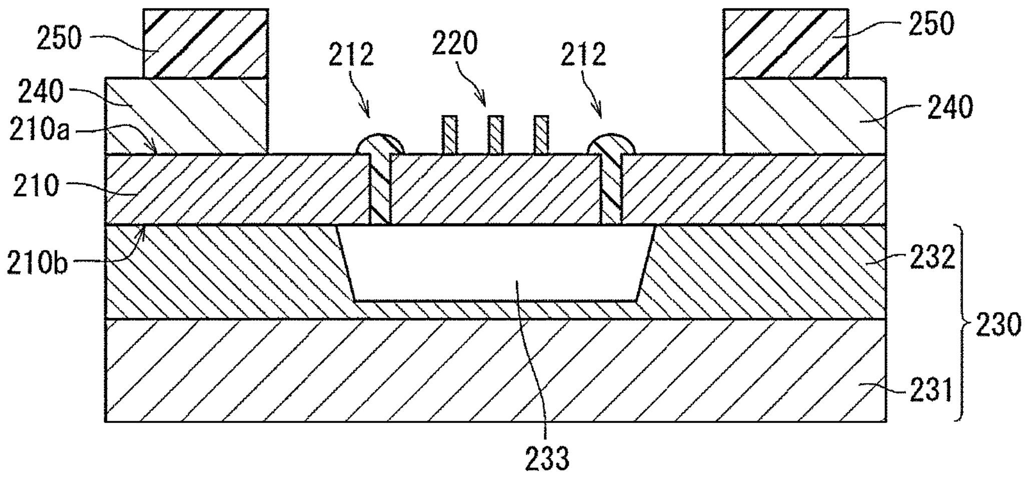
FIG. 42 is a schematic sectional view illustrating the manufacturing process of the acoustic wave device.

Next, in the step S25, the support 250 is formed. As illustrated in FIG. 42, the support 250 is formed on the first main surface 210*a* of the piezoelectric layer 210 such that at least a portion of the support 250 overlaps the wiring electrode 240 in the lamination direction of the support member 230 and the piezoelectric layer 210. The support 250 can be formed, for example, by applying, exposing, developing, and curing a photosensitive resin.

Figure 43:
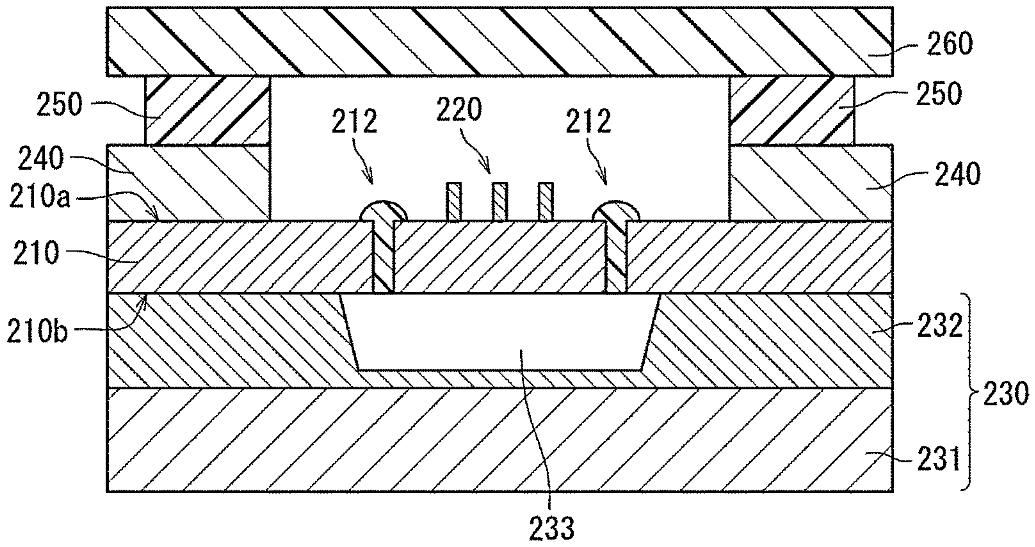
FIG. 43 is a schematic sectional view illustrating the manufacturing process of the acoustic wave device.

Next, in the step S26, the lid member 260 is formed. As illustrated in FIG. 43, the lid member 260 is formed on the support 250 so as to cover the cavity of the support 250. The lid member 260 can be formed, for example, by laminating a resin sheet on the support 250 and curing the resin sheet.

Figure 44:
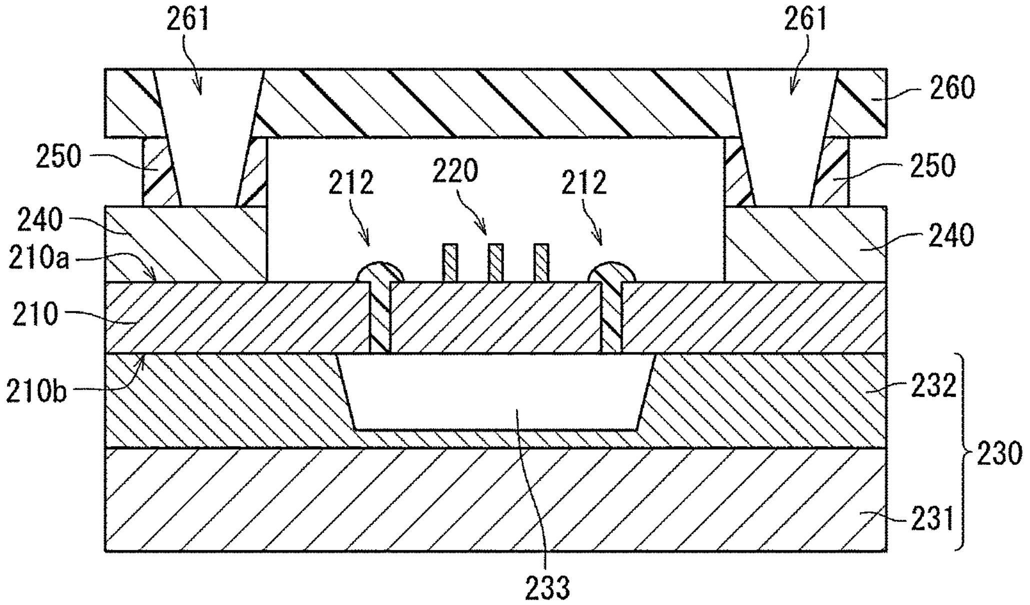
FIG. 44 is a schematic sectional view illustrating the manufacturing process of the acoustic wave device.

Next, in the step S27, the terminal hole 261 is formed. As illustrated in FIG. 44, the terminal hole 261 is formed to extend through the support 250 and the lid member 260 to expose the wiring electrodes 240. The terminal hole 261 can be formed at a desired position of the support 250 and the lid member 260 by, for example, laser irradiation. Alternatively, for example, the support 250 and the lid member 260 can be made of a photosensitive resin, and the terminal hole 261 can be formed by an exposure phenomenon.

Figure 45:
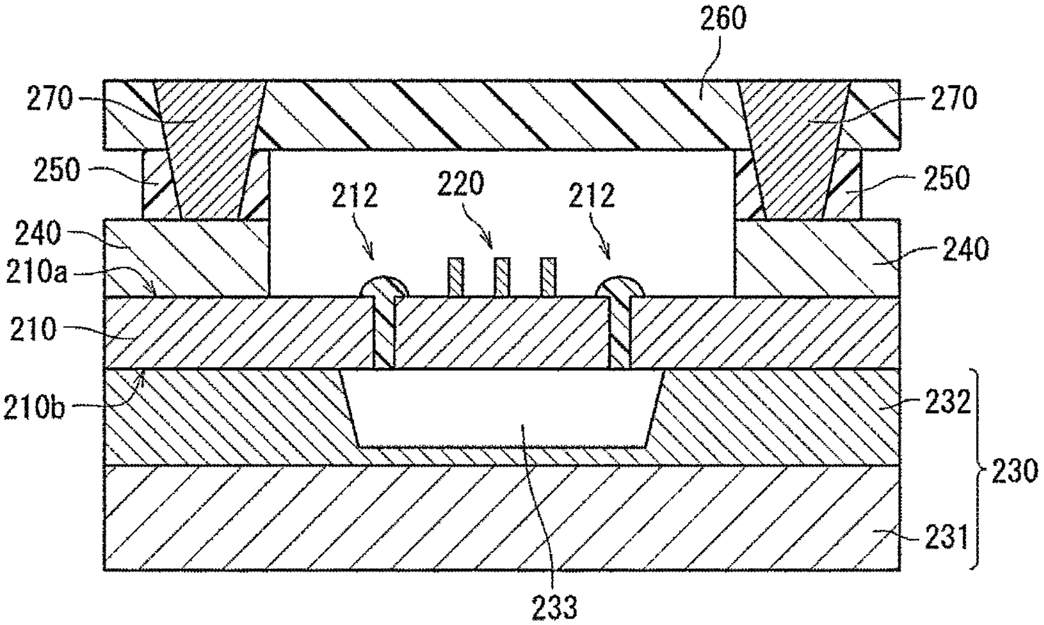
FIG. 45 is a schematic sectional view illustrating the manufacturing process of the acoustic wave device.

Next, in the step S28, the under-bump metal 270 is formed. As illustrated in FIG. 45, the under-bump metal 270 is formed in the terminal hole 261. The under-bump metal 270 can be formed, for example, by electrolytic plating powered by the wiring electrode 240.

Figure 46:
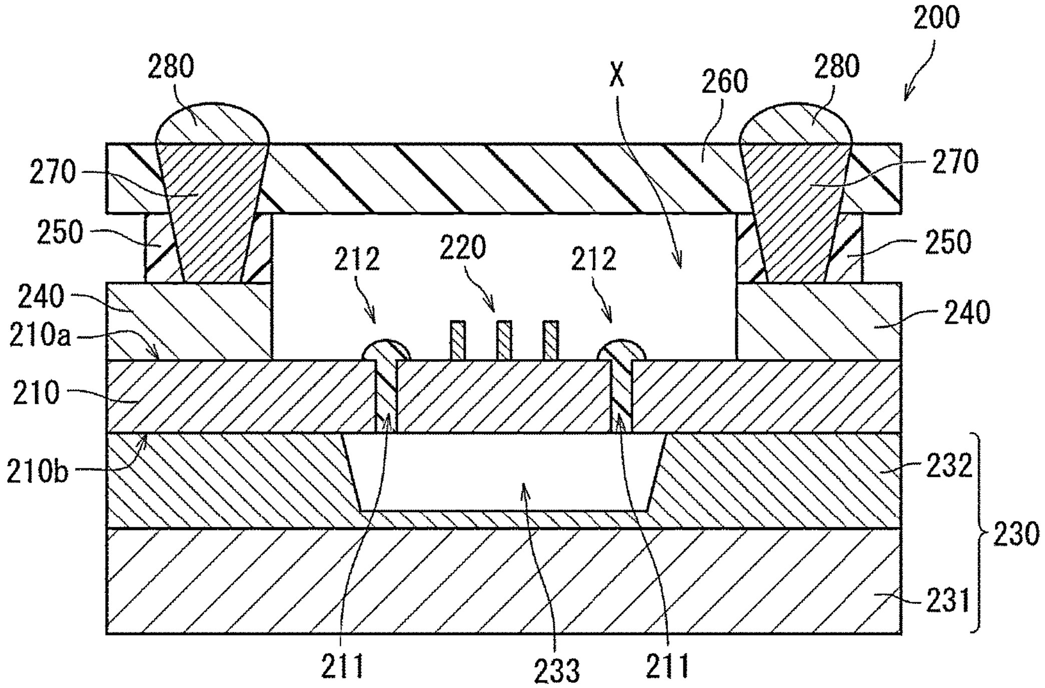
FIG. 46 is a schematic sectional view illustrating the manufacturing process of the acoustic wave device.

Next, in the step S29, the bump 280 is formed. As illustrated in FIG. 46, the bump 280 is formed on the under-bump metal 270 to electrically connect to the under-bump metal 270. The bump 280 can be formed by solder printing reflow, for example. Finally, the acoustic wave device 200 is completed by separation into individual pieces by cutting with a dicing machine. Since the functional electrode 220 is surrounded by the support 250 and the lid member 260, the functional electrode 220 is protected by the support 250 and the lid member 260, and the functional electrode 220 can be prevented from being damaged during the cutting with a dicing machine.

According to the acoustic wave device 200 of the present preferred embodiment, the wiring electrode 240, the support 250, the lid member 260, the under-bump metal 270 and the bump 280 are provided. The wiring electrode 240 is formed on the first main surface 210*a* of the piezoelectric layer 210 and electrically connected to the functional electrode 220. The support 250 is formed on the first main surface 110*a* of the piezoelectric layer 210. The lid member 260 is disposed on the support 250. The under-bump metal 270 extends through the support 250 and lid member 260 and is connected to the wiring electrode 240. The bump 280 is connected to the under-bump metal 270.

Such a configuration facilitates mounting of the acoustic wave device 200 on a module.

According to the method of manufacturing the acoustic wave device 200 of the present preferred embodiment, the piezoelectric layer forming step S21 includes forming, on the first main surface 210*a* of the piezoelectric layer 210, the wiring electrode 240 electrically connected to the functional electrodes 220. The method of manufacturing the acoustic wave device 200 further includes the support forming step S25, the lid member forming step S26, the terminal hole forming step S27, the under-bump metal forming step S28, and the bump forming step S29. In the support forming step S25, the support is formed on the first main surface 210*a* of the piezoelectric layer 210 such that at least a portion of the support overlaps the wiring electrode 240 in plan view in the lamination direction of the support member 230 and the piezoelectric layer 210. In the lid member forming step S26, the lid member 260 is formed on the support 250. In the terminal hole forming step S27, the terminal hole 261 that extends through the support 250 and the lid member 260 and exposes the wiring electrode 240 is formed. In the under-bump metal forming step S28, the under-bump metal 270 is formed in the terminal hole 261. In the bump forming step S29, the bump is formed on the under-bump metal.

Such a configuration enables cutting with a dicing machine by mechanical cutting for separating into individual pieces while improving the mechanical strength of the piezoelectric layer 210. Therefore, the acoustic wave device 200 can be separated into individual pieces, and can be mounted on a module.

Modification 6

Figure 47:
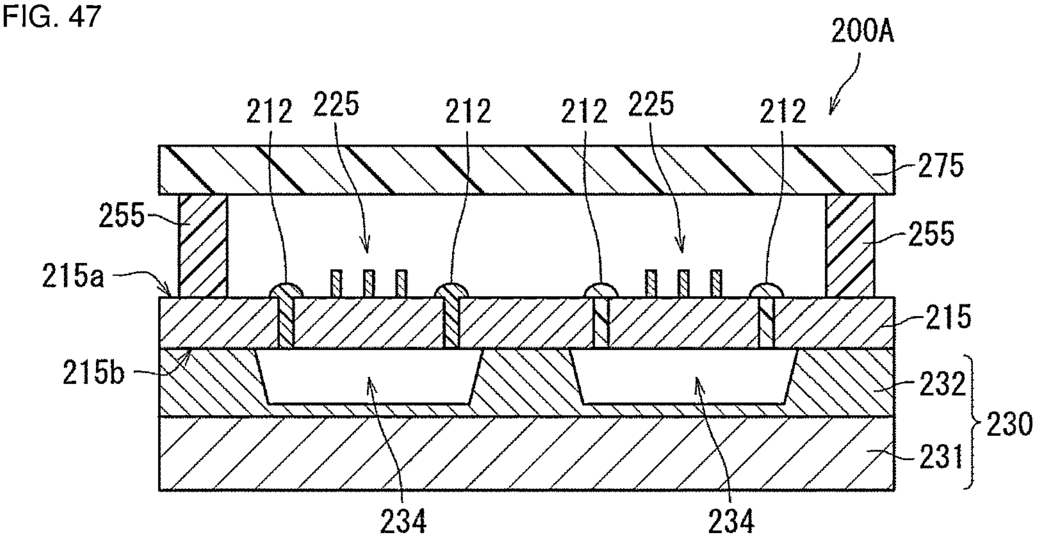
FIG. 47 is a schematic sectional view of an acoustic wave device of Modification 6 of a preferred embodiment of the present invention.
Figure 48:
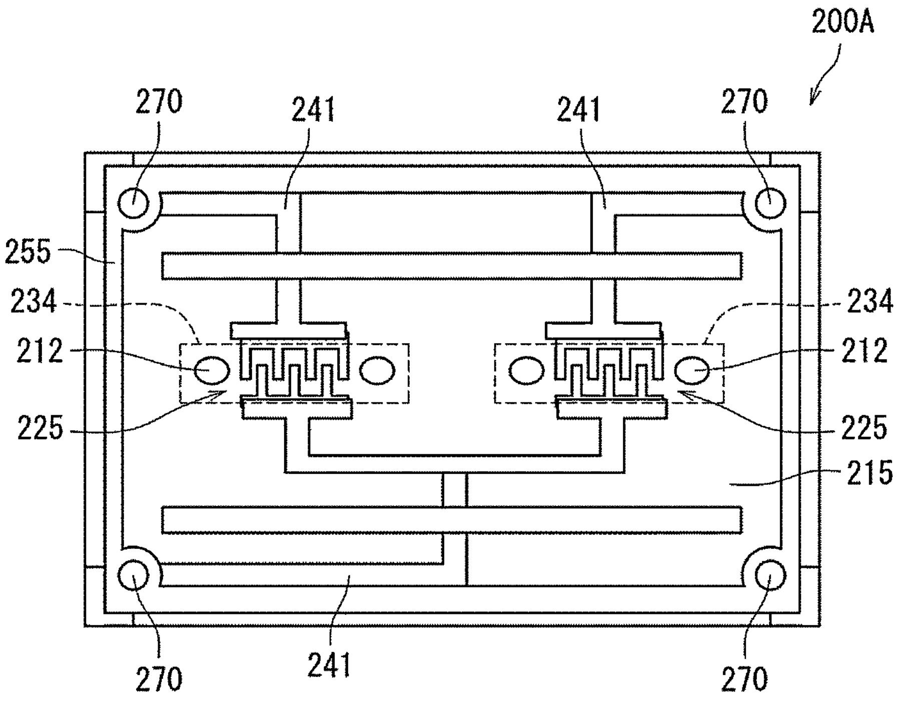
FIG. 48 is a schematic plan view of the acoustic wave device of FIG. 47 excluding the lid member.
Figure 49:
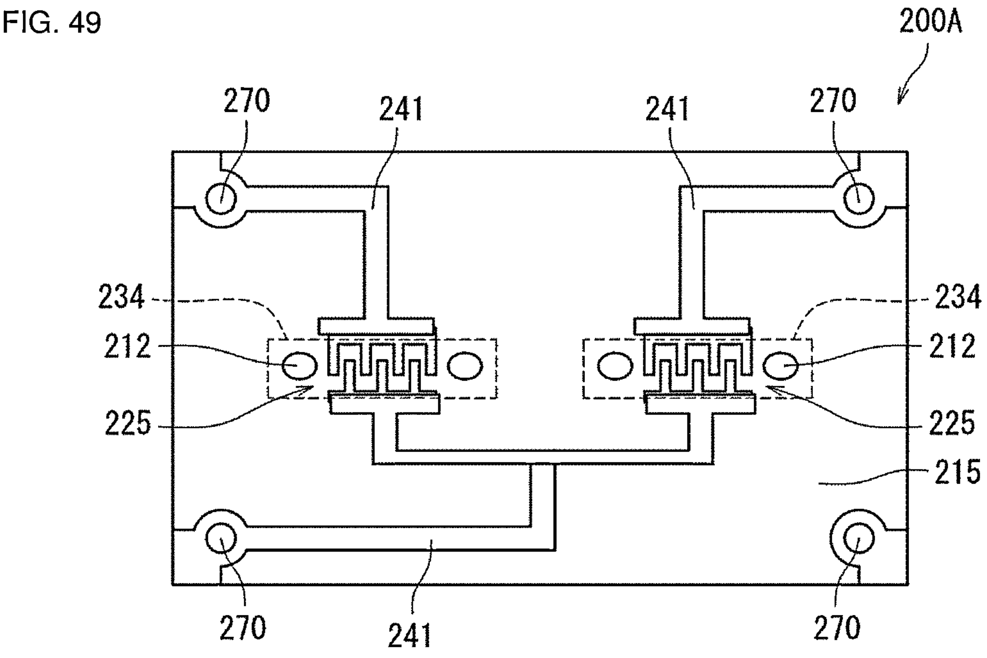
FIG. 49 is a schematic plan view of the acoustic wave device of FIG. 47 excluding the lid member and support.

FIG. 47 is a schematic sectional view of an acoustic wave device of Modification 6 of a preferred embodiment of the present invention. FIG. 48 is a schematic plan view of the acoustic wave device of FIG. 47 excluding the lid member. FIG. 49 is a schematic plan view of the acoustic wave device of FIG. 47 excluding the lid member and support. An acoustic wave device 200A is different from the third preferred embodiment in that a plurality of functional electrodes 225 are formed on a piezoelectric layer 215.

As illustrated in FIG. 47, two functional electrodes 225 are provided on the piezoelectric layer 215 in the acoustic wave device 200A. Two hollow portions 234 are provided at positions overlapping with the two functional electrodes 225 of the intermediate layer 232 of the support member 230 in plan view.

As illustrated in FIG. 48, the support 255 is disposed on the first main surface 215*a* of the piezoelectric layer 215 so as to surround the two functional electrodes 225. As illustrated in FIG. 49, the wiring electrode 241 is electrically connected to at least one of the two functional electrodes 225.

With such a configuration, an acoustic wave device 200A having a plurality of functional electrodes 225 can be provided. Note that the number of functional electrodes 225 provided in the acoustic wave device 200A is not limited to two, and may be three or more. The number of hollow portions 234 provided in the support member 230 is not limited to two, and may be one or three or more.

Modification 7

Figure 50:
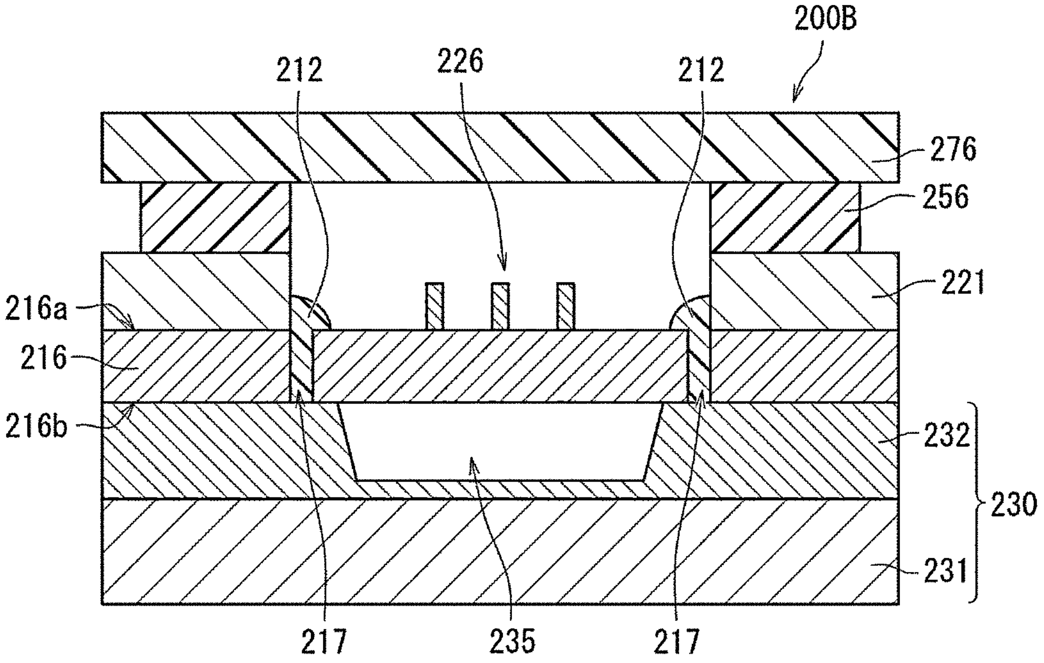
FIG. 50 is a schematic sectional view of an acoustic wave device of Modification 7 of a preferred embodiment of the present invention.
Figure 51:
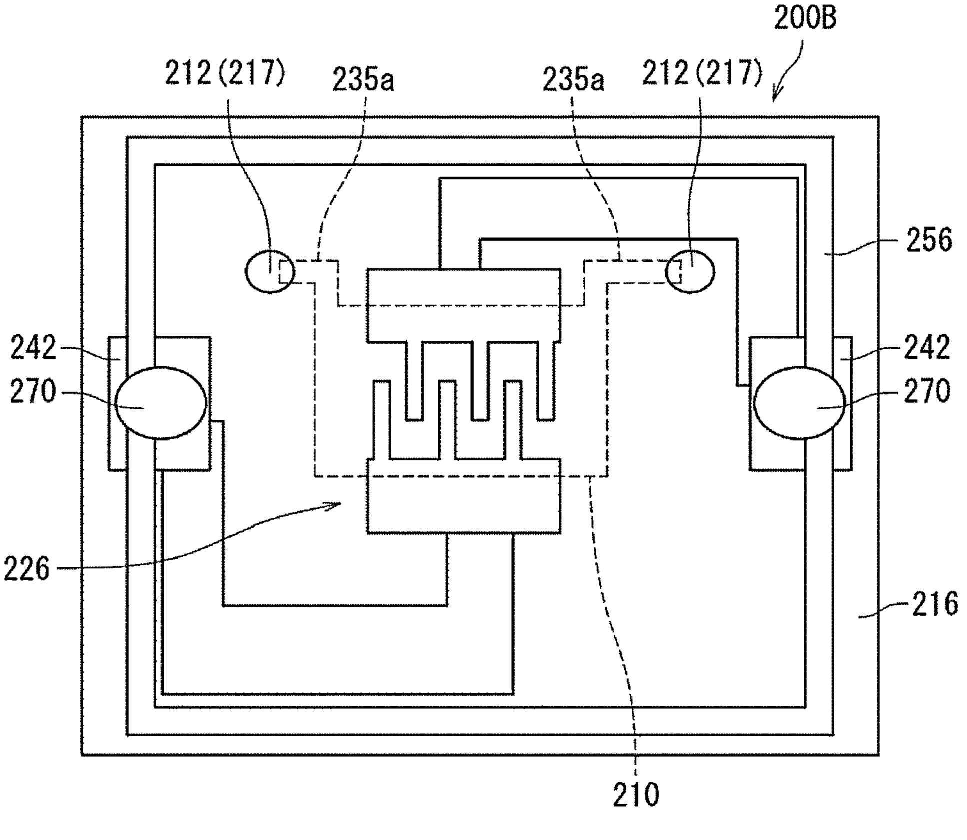
FIG. 51 is a schematic sectional view of the acoustic wave device of FIG. 50 excluding the lid member.

FIG. 50 is a schematic sectional view of an acoustic wave device of Modification 7 of a preferred embodiment of the present invention. FIG. 51 is a schematic sectional view of the acoustic wave device of FIG. 50 excluding the lid member. An acoustic wave device 200B is different from the third preferred embodiment in that a through hole 217 is formed at a position not overlapping a hollow portion 235 in plan view in the lamination direction of the support member 230 and the piezoelectric layer 216.

As illustrated in FIG. 50, the through hole 217 formed in the piezoelectric layer 216 is disposed at a position that does not overlap the hollow portion 235 in plan view. In this case, as illustrated in FIG. 51, a passage 235*a* extending from the hollow portion 235 to the through hole 217 is provided, and the through hole 217 and the hollow portion 235 communicate with each other with the passage 235*a* therebetween.

With this configuration, the through hole 217 can be formed in the piezoelectric layer 216 at the position away from the functional electrode 226, so that the mechanical strength of the piezoelectric layer 216 can be further improved.

Fourth Preferred Embodiment

An acoustic wave device according to a fourth preferred embodiment of the present invention will be described. In the fourth preferred embodiment, descriptions of the details overlapping those of the first, second, and third preferred embodiments will be omitted as appropriate. The details described in the first and second preferred embodiments can be applied to the fourth preferred embodiment.

Figure 52:
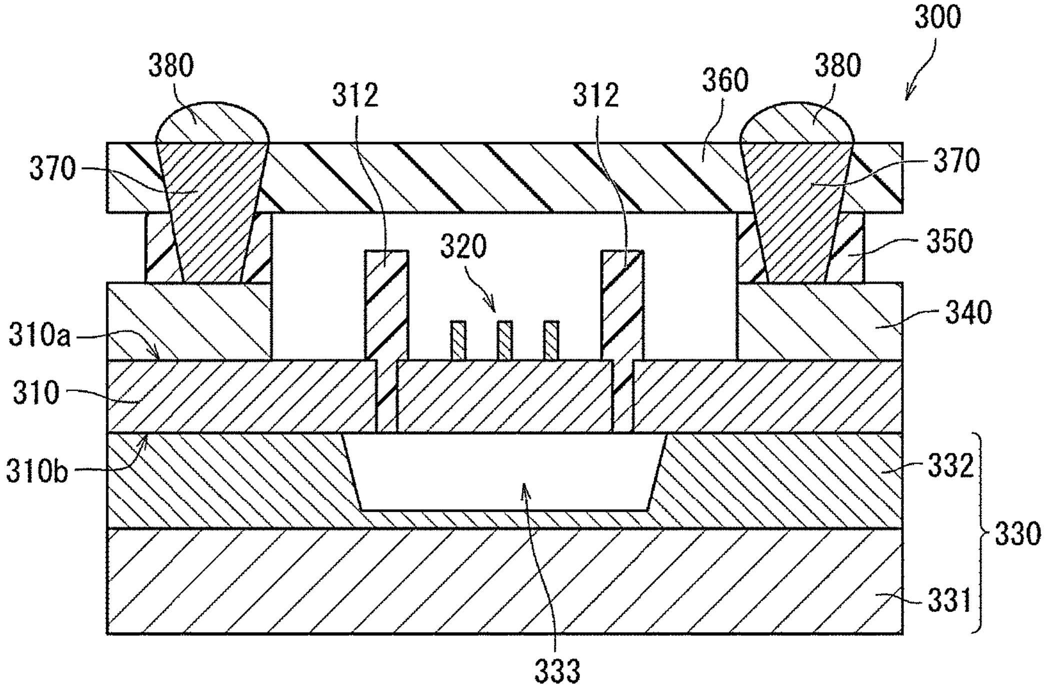
FIG. 52 is a schematic sectional view of an acoustic wave device according to a fourth preferred embodiment of the present invention.

FIG. 52 is a schematic sectional view of the acoustic wave device according to the fourth preferred embodiment of the present disclosure. As illustrated in FIG. 52, in an acoustic wave device 300, a reinforcing lid portion 312 is made of the same material as that of a support 350. Further, in the acoustic wave device 300, a gap is formed between the reinforcing lid portion 312 and a lid member 360.

Figure 53:
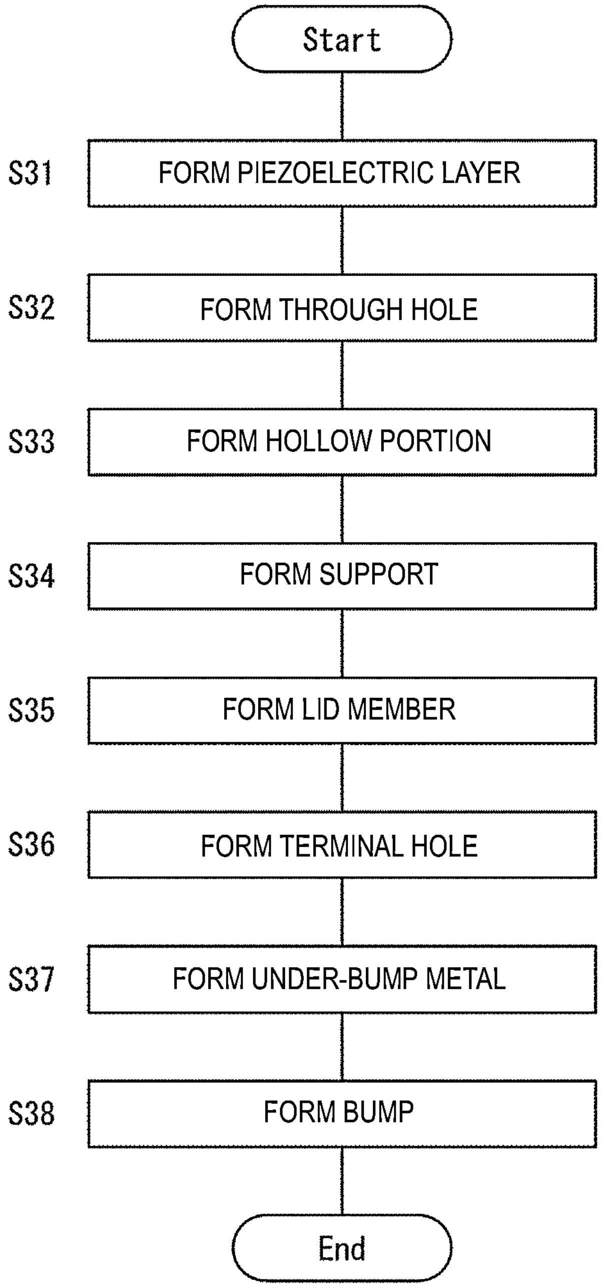
FIG. 53 is a flow chart illustrating a method of manufacturing an acoustic wave device.
Figure 54:
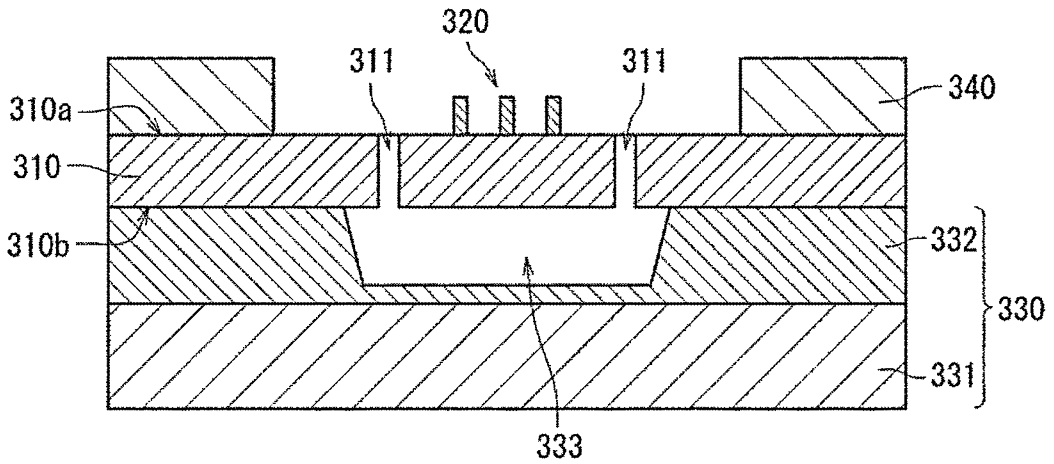
FIG. 54 is a schematic sectional view illustrating the manufacturing process of the acoustic wave device.
Figure 55:
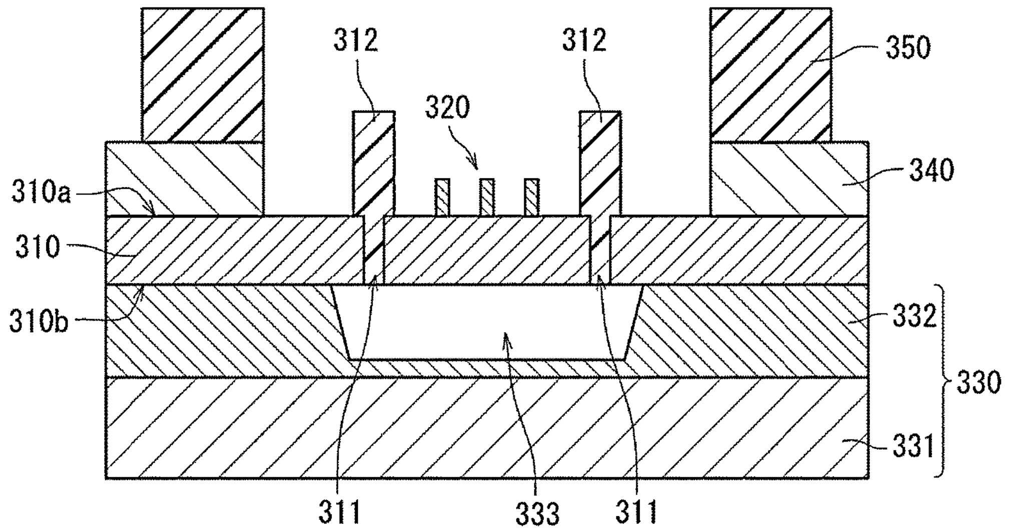
FIG. 55 is a schematic sectional view illustrating a manufacturing process of the acoustic wave device.

FIG. 53 is a flow chart illustrating a method of manufacturing the acoustic wave device. FIGS. 54 and 55 are schematic sectional views illustrating a manufacturing process of the acoustic wave device. A method of manufacturing the acoustic wave device 300 will be described with reference to FIGS. 53 and 55. Note that steps S31 to S33 and steps S35 to S38 in FIG. 53 are the same processing as steps S21 to S23 and steps S26 to S29 of the third preferred embodiment, and therefore descriptions thereof are omitted.

In the steps S31 to S33, as illustrated in FIG. 54, the piezoelectric layer 310 is formed with the functional electrode 320 and the wiring electrode 340 disposed on the first main surface 310*a* and the support member 330 disposed on the second main surface 310*b*. A through hole 311 is formed in the piezoelectric layer 310 and a hollow portion 333 is formed in an intermediate layer 332.

Next, in the step S34, the support 350 is formed. The support 350 is formed by applying a photosensitive resin to the first main surface 310*a* of the piezoelectric layer 310, and exposing, developing, and curing the photosensitive resin. The support 350 is formed such that at least a portion of the support 350 overlaps the wiring electrode 340 in plan view. At this time, as illustrated in FIG. 55, the reinforcing lid portion 312 is formed to close the through hole 311. The reinforcing lid portion 312 can be formed by exposing, developing, and curing the same photosensitive resin as that of the support 350.

In the present preferred embodiment, since the support 350 and the reinforcing lid portion 312 are made of the same material, the reinforcing lid portion 312 can also be formed when the support 350 is formed. Therefore, formation of the reinforcing lid portion 312 is facilitated. In other words, the process of forming the support 350 and the process of forming the reinforcing lid portion 312 can be performed together.

After forming the support 350 and the reinforcing lid portion 312 on the first main surface 310*a* of the piezoelectric layer 310, the lid member 360, the terminal hole, the under-bump metal 370, and the bump 380 are formed in the steps S35 to S38. After that, the acoustic wave device 300 is completed by separating into individual pieces by the cutting with a dicing machine.

According to the acoustic wave device 300 of the present preferred embodiment, the reinforcing lid portion 312 is made of the same material as that of the support 350. With such a configuration, the reinforcing lid portion and the support can be formed collectively, and the manufacturing cost can be reduced.

A gap is formed between the reinforcing lid portion 312 and the lid member 360. With such a configuration, the mechanical strength of the acoustic wave device 300 can be improved.

The method of manufacturing the acoustic wave device 300 of the present preferred embodiment includes a piezoelectric layer forming step S31, a through hole forming step S32, a hollow portion forming step S33, a support forming step S34, a lid member forming step S35, a terminal hole forming step S36, an under-bump metal forming step S37, and a bump forming step S38. The support forming step S34 includes forming a reinforcing lid portion 312 that closes the through hole 311.

With such a configuration, the support 350 and the reinforcing lid portion 312 can be formed at the same time, so that the manufacturing process can be simplified and the manufacturing cost can be reduced.

Modification 8

Figure 56:
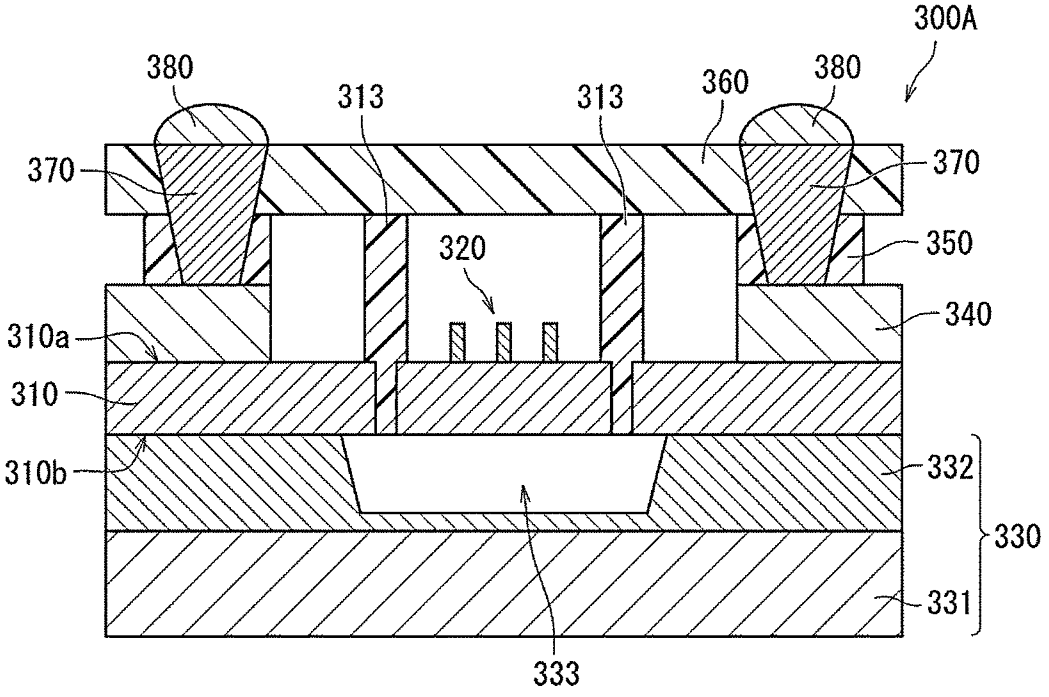
FIG. 56 is a schematic sectional view of an acoustic wave device of Modification 8 of a preferred embodiment of the present invention.

FIG. 56 is a schematic sectional view of an acoustic wave device of Modification 8 of a preferred embodiment of the present invention. The acoustic wave device 300A is different from the fourth preferred embodiment in that a reinforcing lid portion 313 is in contact with the lid member 360. Since the reinforcing lid portion 313 is in contact with the lid member 360, the lid member 360 can be supported by the reinforcing lid portion 313 in addition to the support 350. Therefore, the mechanical strength of the acoustic wave device 300A as a whole can be improved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:

a piezoelectric layer that includes a first main surface and a second main surface opposite to the first main surface;

a functional electrode on the piezoelectric layer; and a support on the second main surface of the piezoelectric layer and including a support substrate; wherein the support is provided with a hollow portion overlapping at least a portion of the functional electrode in plan view in a lamination direction of the support and the piezoelectric layer;

a through hole communicating with the hollow portion is provided in the piezoelectric layer; and the first main surface of the piezoelectric layer is provided with a reinforcing lid portion to close the through hole.

2. The acoustic wave device according to claim 1, wherein the reinforcing lid portion includes a first reinforcing lid portion on the first main surface.

3. The acoustic wave device according to claim 1, wherein the reinforcing lid portion includes a second reinforcing lid portion in at least a portion inside the through hole.

4. The acoustic wave device according to claim 3, wherein the second reinforcing lid portion extends to a bottom portion of the hollow portion.

5. The acoustic wave device according to claim 1, wherein the through hole is located at a position that does not overlap the hollow portion in plan view in the lamination direction of the support and the piezoelectric layer.

6. The acoustic wave device according to claim 1, wherein the reinforcing lid portion includes resin.

7. The acoustic wave device according to claim 6, wherein the resin includes a photosensitive material.

8. The acoustic wave device according to claim 6, wherein the resin includes a filler.

9. The acoustic wave device according to claim 1,
- wherein the support includes an intermediate layer laminated on a piezoelectric layer side; and
- the hollow portion is located in the intermediate layer.

10. The acoustic wave device according to claim 1, wherein the hollow portion is located in the support substrate.

11. The acoustic wave device according to claim 1, further comprising:
- a wiring electrode on the first main surface of the piezoelectric layer and electrically connected to the functional electrode;
- a support on the first main surface of the piezoelectric layer;
- a lid that is disposed on the support;
- an under-bump metal that extends through the support and the lid and is electrically connected to the wiring electrode; and
- a bump that is connected to the under-bump metal.

12. The acoustic wave device according to claim 11, wherein the reinforcing lid portion includes a same material as the support.

13. The acoustic wave device according to claim 11, wherein a gap is between the reinforcing lid portion and the lid.

14. The acoustic wave device according to claim 11, wherein the reinforcing lid portion is in contact with the lid.

15. The acoustic wave device according to claim 1, wherein the functional electrode includes an IDT electrode including a first busbar and a second busbar facing each other, a first electrode finger connected to the first busbar, and a second electrode finger connected to the second busbar.

16. The acoustic wave device according to claim 15, wherein when d is a film thickness of the piezoelectric layer and p is a center-to-center distance between adjacent first and second electrode fingers, d/p is about 0.5 or less.

17. The acoustic wave device according to claim 16, wherein d/p is about 0.24 or less.

18. The acoustic wave device according to claim 16,
- wherein when viewed in a direction in which the first electrode finger and the second electrode finger are arrayed, a region where the adjacent first and second electrode fingers overlap each other is an excitation region; and
- when MR is a metallization ratio of the electrode finger to the excitation region, MR≤about 1.75(d/p)+0.075 is satisfied.

19. The acoustic wave device according to claim 1, wherein
- the functional electrode includes an upper electrode provided on the first main surface of the piezoelectric layer and a lower electrode provided on the second main surface of the piezoelectric layer; and
- in plan view in the lamination direction of the support and the piezoelectric layer, there is a portion where the upper electrode and the lower electrode overlap each other.

20. The acoustic wave device according to claim 1, wherein the piezoelectric layer is made of lithium niobate or lithium tantalate.

21. The acoustic wave device according to claim 20, wherein
- an Euler angle (φ, θ, ψ) of the lithium niobate or lithium tantalate is in a range of Expression (1), Expression (2), or Expression (3):

$$(0°\pm10°,\ 0° \text{ to } 20°,\ \text{any } \psi) \quad \text{Expression (1)}$$

$$(0°\pm10°,\ 20° \text{ to } 80°,\ 0° \text{ to } 60°(1-(\theta-50)^2/900)^{1/2}) \text{ or } (0°\pm10°,\ 20° \text{ to } 80°,\ [180°-60°(1-(\theta-50)^2/900)^{1/2}] \text{ to } 180°) \quad \text{Expression (2)}$$

$$(0°\pm10°,\ [180°-30°(1-(\psi-90)^2/8100)^{1/2}] \text{ to } 180°,\ \text{any } \psi) \quad \text{Expression (3).}$$

22. A method of manufacturing an acoustic wave device, the method comprising:
- a piezoelectric layer forming step of laminating a support including a support substrate on a piezoelectric layer including a first main surface and a second main surface opposite to the first main surface and including a sacrificial layer formed on the second main surface, and forming a functional electrode on the piezoelectric layer;
- a through hole forming step of forming a through hole extending through the piezoelectric layer at a position of the piezoelectric layer, the position overlapping the sacrificial layer in plan view in a lamination direction of the support and the piezoelectric layer;
- a hollow portion forming step of removing the sacrificial layer from the through hole to form a hollow portion in the support; and
- a reinforcing lid portion forming step of forming a reinforcing lid portion that closes the through hole.

23. The method of manufacturing an acoustic wave device according to claim 22, wherein
- the piezoelectric layer forming step includes forming, on the piezoelectric layer, a wiring electrode electrically connected to the functional electrode; and
- the method further comprises:
- a support forming step of forming a support on the first main surface of the piezoelectric layer such that at least a portion of the support overlaps the wiring electrode in plan view in the lamination direction of the support and the piezoelectric layer;
- a lid forming step of forming a lid on the support;
- a terminal hole forming step of forming a terminal hole extending through the support and the lid and exposing the wiring electrode;
- an under-bump metal forming step of forming an under-bump metal in the terminal hole; and
- a bump forming step of forming a bump on the under-bump metal.

24. The method of manufacturing an acoustic wave device according to claim 22, wherein the reinforcing lid portion forming step includes applying a resin material including a photosensitive material to a position of the first main surface of the piezoelectric layer at which the through hole is closed, and exposing, developing, and curing the resin material.

25. A method of manufacturing an acoustic wave device, the method comprising:
- a piezoelectric layer forming step of laminating a support including a support substrate on a piezoelectric layer including a sacrificial layer formed on a second main surface out of a first main surface and the second main surface facing each other, and forming, on the piezoelectric layer, a functional electrode and a wiring electrode electrically connected to the functional electrode;

a through hole forming step of forming a through hole at a position of the piezoelectric layer, the position overlapping the sacrificial layer in plan view in a lamination direction of the support and the piezoelectric layer;

a hollow portion forming step of removing the sacrificial layer from the through hole to form a hollow portion in the support;

a support forming step of applying a photosensitive resin to the first main surface of the piezoelectric layer, and exposing, developing, and curing the photosensitive resin to form a support such that at least a portion of the support overlaps the wiring electrode in plan view;

a lid forming step of forming a lid on the support;

a terminal hole forming step of forming a terminal hole extending through the support and the lid and exposing the wiring electrode;

an under-bump metal forming step of forming an under-bump metal in the terminal hole; and a bump forming step of forming a bump on the under-bump metal; wherein the support forming step includes forming a reinforcing lid portion that closes the through hole.

* * * * *